US012583973B2

(12) United States Patent
Urano et al.

(10) Patent No.: US 12,583,973 B2
(45) Date of Patent: Mar. 24, 2026

(54) POLYIMIDE-BASED POLYMER, POSITIVE PHOTOSENSITIVE RESIN COMPOSITION, NEGATIVE PHOTOSENSITIVE RESIN COMPOSITION, PATTERNING METHOD, METHOD FOR FORMING CURED FILM, INTERLAYER INSULATING FILM, SURFACE PROTECTIVE FILM, AND ELECTRONIC COMPONENT

(71) Applicant: SHIN-ETSU CHEMICAL CO., LTD., Tokyo (JP)

(72) Inventors: Hiroyuki Urano, Joetsu (JP); Masashi Iio, Joetsu (JP); Katsuya Takemura, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 882 days.

(21) Appl. No.: 17/679,455

(22) Filed: Feb. 24, 2022

(65) Prior Publication Data

US 2022/0289911 A1 Sep. 15, 2022

(30) Foreign Application Priority Data

Mar. 9, 2021 (JP) .................................. 2021-36923

(51) Int. Cl.

| | |
|---|---|
| ***C08G 73/10*** | (2006.01) |
| ***G03F 7/004*** | (2006.01) |
| ***G03F 7/038*** | (2006.01) |
| ***G03F 7/039*** | (2006.01) |
| ***G03F 7/11*** | (2006.01) |
| ***G03F 7/20*** | (2006.01) |
| ***G03F 7/32*** | (2006.01) |
| ***G03F 7/38*** | (2006.01) |
| ***G03F 7/40*** | (2006.01) |

(52) U.S. Cl.

CPC ..... *C08G 73/1046* (2013.01); *C08G 73/1075* (2013.01); *G03F 7/0045* (2013.01); *G03F 7/0382* (2013.01); *G03F 7/0392* (2013.01); *G03F 7/11* (2013.01); *G03F 7/2006* (2013.01); *G03F 7/322* (2013.01); *G03F 7/38* (2013.01); *G03F 7/40* (2013.01)

(58) Field of Classification Search

CPC ............ C08G 73/1046; C08G 73/1075; G03F 7/0045; G03F 7/0382; G03F 7/0392; G03F 7/11; G03F 7/2006; G03F 7/322; G03F 7/38; G03F 7/40

See application file for complete search history.

(56) References Cited

U.S. PATENT DOCUMENTS

| | | | | |
|---|---|---|---|---|
| 3,957,512 | A | 5/1976 | Kleeberg et al. | |
| 2011/0143103 | A1 | 6/2011 | Furuya et al. | |
| 2018/0024434 | A1 * | 1/2018 | Takemura | G03F 7/168 430/280.1 |

FOREIGN PATENT DOCUMENTS

| | | | | |
|---|---|---|---|---|
| JP | S49-115541 | A | 11/1974 | |
| JP | S55-045746 | A | 3/1980 | |
| JP | 4-328127 | A | 11/1992 | |
| JP | 2005-139302 | A | 6/2005 | |
| JP | 2005-154436 | A | 6/2005 | |
| JP | 2006-313237 | A | 11/2006 | |
| JP | 2007-199653 | A | 8/2007 | |
| JP | 2011-123278 | A | 6/2011 | |
| JP | 2016204506 | A * | 12/2016 | |
| KR | 2013013202 | A * | 2/2013 | G03F 7/004 |
| KR | 10-2014-0115387 | A | 10/2014 | |

OTHER PUBLICATIONS

English Translation of KR 2013-013202 A; Ho C J; Published: Feb. 6, 2013 (Year: 2013).*

Enlish Translation of JP 2016-204506 A; Masuda Y; Published: Dec. 8, 2016 (Year: 2016).*

Aug. 3, 2022 Extended Search Report issued in European Patent Application No. 22159652.1.

* cited by examiner

*Primary Examiner* — Mark F. Huff
*Assistant Examiner* — Richard David Champion
(74) *Attorney, Agent, or Firm* — Oliff PLC

(57) ABSTRACT

A polymer in the present invention contains a structural unit represented by the following general formula (1), where $X_1$ is a tetravalent organic group, $Z_1$ is a divalent organic group, and "k" is an integer of 1 to 3. Thus, the present invention provides: a positive photosensitive resin composition and a negative photosensitive resin composition which exhibit favorable solvent solubility and are capable of forming a fine pattern with high resolution as a result of solubility in an aqueous alkaline solution; a polyimide-based polymer usable as a base resin for these compositions; and a patterning method and a method for forming a cured film which use the compositions.

(1)

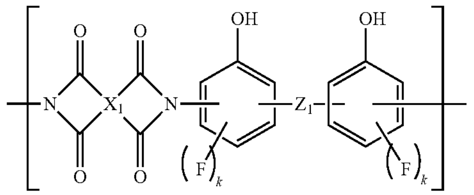

20 Claims, No Drawings

POLYIMIDE-BASED POLYMER, POSITIVE PHOTOSENSITIVE RESIN COMPOSITION, NEGATIVE PHOTOSENSITIVE RESIN COMPOSITION, PATTERNING METHOD, METHOD FOR FORMING CURED FILM, INTERLAYER INSULATING FILM, SURFACE PROTECTIVE FILM, AND ELECTRONIC COMPONENT

TECHNICAL FIELD

The present invention relates to a polymer having a polyimide structure, a positive photosensitive resin composition, a negative photosensitive resin composition, a patterning method, a method for forming a cured film, an interlayer insulating film, a surface protective film, and an electronic component.

BACKGROUND ART

As various electronic devices such as personal computers, digital cameras and mobile phones progress toward miniaturization and high performance, demands for further miniaturization, thinning and densification are being rapidly increased also in semiconductor elements. Following this, interlayer insulating films and surface protective films for semiconductor elements are demanded to have more excellent electrical properties, heat resistance, mechanical properties, and the like at the same time.

As photosensitive insulating materials that can form a pattern on a substrate in the high density packaging technology such as three-dimensional lamination, polyimide films have been utilized in the form of a protective film or an insulating layer. Properties of polyimide films, such as insulating property, mechanical strength, and adhesiveness to a substrate, have attracted attention continuously, and even now, development thereof has been carried on highly actively.

Conventionally, as photosensitive polyimide-based materials, there have been proposed materials utilizing a polyamic acid, which is a precursor of polyimide, for example, materials in which photosensitive groups are introduced into carboxyl groups of a polyamic acid by ester bonds (Patent Documents 1, 2). However, in these proposals, after the formation of a patterned film, imidization at a high temperature exceeding 300° C. is indispensable in order to obtain the target polyimide film. Consequently, there are problems that an underlying substrate is constrained because it needs to withstand the high temperature, or that the wiring copper is oxidized.

As improvement for the above, photosensitive polyimides using alkali-soluble imidized resins have been proposed for the purpose of lowering the post-curing temperature (Patent Documents 3, 4). Generally, cyclic polyimides have insufficient solubility in solvent (hereinafter, solvent solubility). Against this problem, the solubility in commonly-used solvents can be guaranteed by incorporating a fluoroalkyl group-containing unit into the polymer structure as disclosed in Patent Documents 3, 4.

Patent Document 3 proposes a negative photosensitive composition containing a ring-closing polyimide. The use of 2,2-bis(4-amino-3-hydroxyphenyl)hexafluoropropane as the diamine unit enables both of the dissolution in cyclohexanone and alkali development.

Patent Document 4 proposes a positive photosensitive resin composition including a ring-closing polyimide, a photoacid generator, and a thermal crosslinking agent having a methylol group. Both of the dissolution into γ-butyrolactone and alkali development are achieved by using 2,2-bis(4-amino-3-hydroxyphenyl)hexafluoropropane as the diamine unit and using 2,2'-bis(3,4-dicarboxyphenyl) hexafluoropropane dianhydride as the acid anhydride unit.

Such fluoroalkyl groups are effective in improving the solvent solubility. Nevertheless, some compounds belonging to the group of perfluoroalkyl compounds and polyfluoroalkyl compounds (PFAS) have risks as environmental load and health hazard. These are listed as restrictive substances by the European REACH (Registration, Evaluation, Authorization and Restriction of Chemicals) regulation. This regulation is expected to put stricter restriction in the future. Based on such circumstances, there may be a restriction when a fluoroalkyl group is included in the material that will permanently remain as an insulating film or protective film in an electronic component.

As stated above, in association with densification and integration of chips, finer patterning in the rewiring technology for insulating protective films is expected to progress more and more in the future. Therefore, there have been strong demands for a photosensitive resin composition which can realize favorable solvent solubility and high resolution without impairing excellent characteristics, such as mechanical properties and adhesiveness of the pattern and the protective film resulting from the composition through heating.

CITATION LIST

Patent Literature

Patent Document 1: JP S49-115541 A

Patent Document 2: JP S55-45746 A

Patent Document 3: JP 2011-123278 A

Patent Document 4: JP 2006-313237 A

SUMMARY OF INVENTION

Technical Problem

The present invention has been made in view of the above-described circumstances. An object of the present invention is to provide a polyimide-based polymer having favorable solvent solubility, soluble in an aqueous alkaline solution, and usable as a base resin for a positive photosensitive resin composition and a negative photosensitive resin composition which enable fine pattern formation with high resolution.

Another object of the present invention is to provide: a positive photosensitive resin composition and a negative photosensitive resin composition which include the polymer soluble in an aqueous alkaline solution in patterning, and which are excellent in resolution and enable fine pattern formation.

Solution to Problem

To achieve the object, the present invention provides a polymer comprising a structural unit represented by the following general formula (1):

(1)

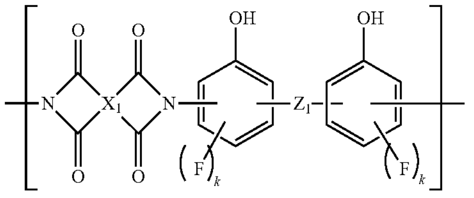

wherein $X_1$ is a tetravalent organic group, $Z_1$ is a divalent organic group, and "k" is an integer of 1 to 3.

Such a polymer has favorable solvent solubility, and the solubility in an aqueous alkaline solution is not impaired, either. Thus, this polymer is usable as a base resin for photosensitive resin compositions which enable fine pattern formation with high resolution.

In this case, the structural unit represented by the general formula (1) is preferably represented by the following general formula (2):

(2)

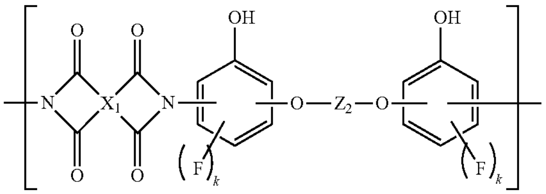

wherein $Z_2$ is a divalent organic group, and $X_1$ and "k" are as defined above.

The raw-material compounds for the polymer containing the structural unit represented by the general formula (2) are readily available, and it is also easy to synthesize such polymer. Thus, the productivity is high.

The inventive polymer may further comprise a structural unit represented by the following general formula (3):

(3)

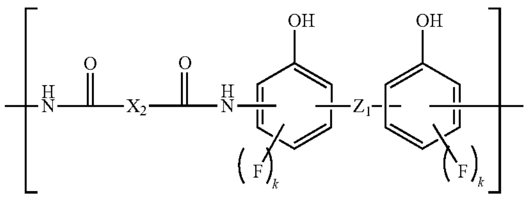

wherein $X_2$ is a divalent organic group, and $Z_1$ and "k" are as defined above.

The inventive polymer further containing the structural unit represented by the general formula (3) has more suitable solvent solubility, and the resulting cured film has favorable mechanical properties, too.

In this case, the structural unit represented by the general formula (3) is preferably represented by the following general formula (4):

(4)

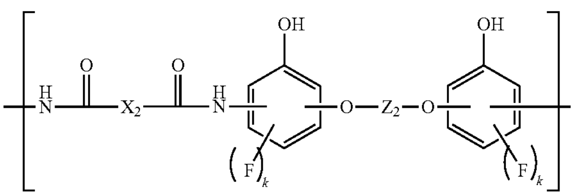

wherein $Z_2$ is a divalent organic group, and $X_2$ and "k" are as defined above.

The raw-material compounds for the polymer containing the structural unit represented by the general formula (4) are readily available, and it is also easy to synthesize such polymer. Thus, the productivity is high.

Moreover, the present invention provides a positive photosensitive resin composition comprising:

(A) the above-described polymer;

(B) a photosensitizer which is a compound having a quinonediazide structure and generates an acid by light to increase a dissolution rate in an aqueous alkaline solution; and (D) a solvent.

The use of a photosensitizer of the component (B) as stated above increases the dissolution rate in a developing solution of an aqueous alkaline solution, so that the exposed part becomes soluble upon patterning. Meanwhile, the unexposed part is not dissolved due to the alkaline-dissolution prevention property of the photosensitizer. Hence, a positive image can be obtained. The polymer containing the structural unit represented by the general formula (1) exhibits alkali solubility by itself. Therefore, residue such as scum and pattern degradation such as tailing are unlikely to occur at the bottom of an open pattern, which benefits fine patterning.

Moreover, in this case, the positive photosensitive resin composition preferably further comprises (C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2), (C-1)

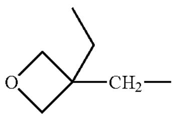

(C-2)

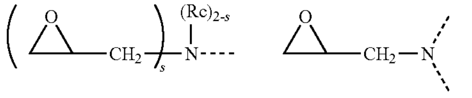

wherein a dotted line represents a bond, Rc represents a linear, branched, or cyclic alkyl group having 1 to 6 carbon atoms, and "s" represents 1 or 2.

Incorporating such component (C) can cause, after the patterning with the inventive positive photosensitive resin composition, crosslinking reaction by post-curing and further raise the strength of the cured product, thereby forming a more suitable cured film.

Further, the present invention provides a negative photosensitive resin composition comprising:

(A') the above-described polymer;

(B') a photoacid generator;

(C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2), (C-1)

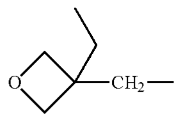

(C-2)

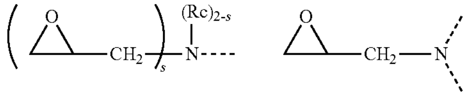

wherein a dotted line represents a bond, Rc represents a linear, branched, or cyclic alkyl group having 1 to 6 carbon atoms, and "s" represents 1 or 2; and (D) a solvent.

The use of a photoacid generator of the component (B') as stated above generates an acid in the exposed part upon patterning, allowing crosslinkage between crosslinking groups of a crosslinking agent of the added component (C) and crosslinking reaction points of the polymer. This makes the exposed part insoluble in a developing solution. Hence, the composition can provide a negative image.

Furthermore, the present invention provides a patterning method comprising steps of:

(1) applying the above-described positive photosensitive resin composition onto a substrate to form a photosensitive material film;

(2) heating the photosensitive material film;

(3) exposing the photosensitive material film with a high energy beam having a wavelength of 190 to 500 nm or an electron beam through a photomask; and (4) developing the film with a developing solution of an aqueous alkaline solution.

Such a patterning method using the above positive photosensitive resin composition makes the exposed part soluble in an aqueous alkaline solution, can form a fine pattern without scum or the like, and achieves high resolution.

Furthermore, the present invention provides a patterning method comprising steps of:

(I) applying the above-described negative photosensitive resin composition onto a substrate to form a photosensitive material film;

(II) heating the photosensitive material film;

(III) exposing the photosensitive material film with a high energy beam having a wavelength of 190 to 500 nm or an electron beam through a photomask; and (IV) developing the film with a developing solution of an aqueous alkaline solution.

Since the polymer serving as the base resin for the inventive negative photosensitive resin composition contains the structural unit represented by the general formula (1), this enables alkali development with an aqueous alkaline solution.

In this event, the patterning method preferably further comprises a step of post-exposure heating of the photosensitive material film between the exposure step (III) and the development step (IV).

Including the heating step (post-exposure bake (PEB)) after the exposure makes it possible to promote the crosslinking reaction between crosslinking groups of the crosslinking agent and crosslinking reaction points of the polymer while an acid generated from the photoacid generator by the exposure is used as a catalyst.

Further, the present invention provides a method for forming a cured film, comprising heating and post-curing a patterned film obtained by the above-described patterning method at a temperature of 100 to 300° C.

Such a method for forming a cured film makes it possible to form a cured film (pattern) with favorable mechanical properties even when it is cured at low temperature.

In addition, the present invention provides an interlayer insulating film or surface protective film comprising a cured film of the above-described positive photosensitive resin composition or the above-described negative photosensitive resin composition.

The cured film formed by curing the inventive positive photosensitive resin composition or the inventive negative photosensitive resin composition is excellent in adhesiveness to a substrate, heat resistance, electrical properties, mechanical strength, and chemical resistance to alkaline stripping solution etc. Moreover, a semiconductor element using the cured film as a protection film is also excellent in reliability. Therefore, the cured film is suitable as a protective film (interlayer insulating film or surface protective film) for electrical and electronic components, semiconductor elements, etc.

Moreover, the present invention provides an electronic component comprising the interlayer insulating film or surface protective film.

Because of the heat resistance, chemical resistance, and insulating property, such a protective film (interlayer insulating film or surface protective film) is effective as an insulating film for semiconductor elements including a rewiring application, an insulating film for multilayer printed circuit boards, etc. Thus, the inventive protection film can make the electronic component excellent in reliability.

Advantageous Effects of Invention

As described above, the present invention makes it possible to provide a polyimide-based polymer having favorable solvent solubility, soluble in an aqueous alkaline solution, and usable as a base resin for a positive photosensitive resin composition and a negative photosensitive resin composition to enable fine pattern formation with high resolution.

In addition, the present invention also makes it possible to provide a positive photosensitive resin composition and a negative photosensitive resin composition which use the polymer soluble in an aqueous alkaline solution upon patterning, and which enables fine pattern formation with excellent resolution.

DESCRIPTION OF EMBODIMENTS

As noted above, there have been demands for a polymer which has favorable solvent solubility and is soluble in an aqueous alkaline solution, and which can be used as a base resin for a photosensitive resin composition capable of forming a fine pattern with high resolution.

As a result of intensive studies to achieve the objects described above, the present inventors have found that when a polymer having a structural unit represented by the following general formula (1) is used as a base resin for a photosensitive resin composition, such a polymer can be utilized for either a positive or negative photosensitive resin composition to allow development with an aqueous alkaline solution. This is because this polymer has favorable solvent solubility and is soluble in a developing solution of an aqueous alkaline solution. Further, the inventors have found that patterns obtained by using these photosensitive resin compositions are fine and have favorable pattern shapes.

Furthermore, the present inventors have found that a protective film excellent in mechanical strength and adhesiveness is obtained by using a photosensitive resin composition containing as a base resin a polymer having a structural unit represented by the general formula (1), and by subjecting the composition to patterning and heating at low temperature. That is, the obtained cured film having a pattern formed using the photosensitive resin composition containing a base resin of a polymer having the structural unit is excellent as an insulating protective film and a protective film for electrical and electronic components. These findings have led to the completion of the present invention. Note that, in the specification, electrical and electronic components are altogether referred to as "electronic component".

Specifically, the present invention is a polymer comprising a structural unit represented by the following general formula (1):

(1)

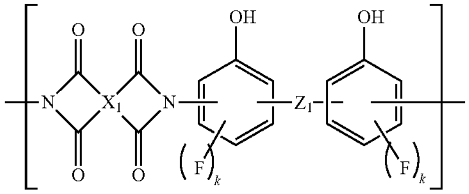

wherein $X_1$ is a tetravalent organic group, $Z_1$ is a divalent organic group, and "k" is an integer of 1 to 3.

Hereinafter, the present invention will be described in detail, but the present invention is not limited to the description below.

[Polymer Containing Polyimide Structure]

The inventive polymer contains a structural unit represented by the following general formula (1) (hereinafter, also referred to as structural unit (1) or the like).

(1)

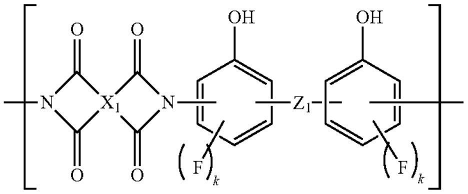

In the formula, $X_1$ represents a tetravalent organic group. $Z_1$ represents a divalent organic group. "k" represents an integer of 1 to 3.

In the general formula (1), each benzene ring of two phenol moieties independently has 1 to 3 fluorine atoms as substituents (k=1 to 3). The number and position of the fluorine atom substitutions are not particularly limited. In view of the raw-material availability, the number of substitutions is preferably 1, and the substitution position is preferably at the ortho position or para position of the phenolic hydroxy group, further preferably ortho position. When a fluorine atom is located at the ortho position or para position of the phenolic hydroxy group, the acidity of the phenolic hydroxy group is increased due to the electron-withdrawing property of the fluorine atom, so that the solubility in a developing solution of an aqueous alkaline solution is enhanced.

As described above, in the present invention, not a fluoroalkyl group but fluorine substituted phenol moieties are introduced to the polymer. Hence, both the solubility in common solvents and alkali developability are high.

In the general formula (1), $X_1$ is a tetravalent organic group, and this tetravalent organic group is not limited. $X_1$ is preferably a tetravalent organic group of an alicyclic aliphatic group or an aromatic group having 4 to 40 carbon atoms, or a tetravalent organic group containing a siloxane skeleton, further preferably a tetravalent organic group shown in the following formula (5). In addition, the structure of $X_1$ may be one kind or a combination of two or more kinds.

(5)

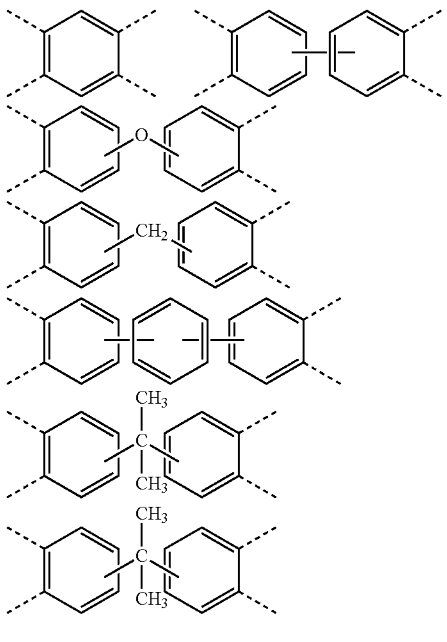

-continued

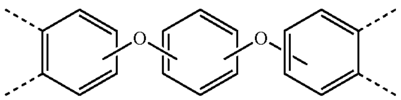

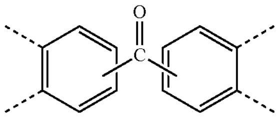

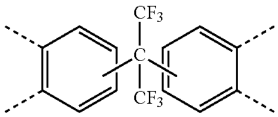

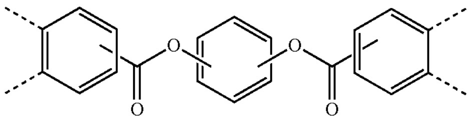

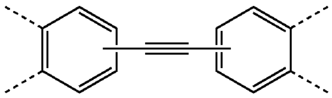

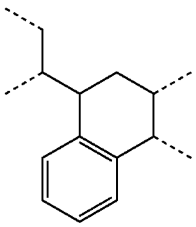

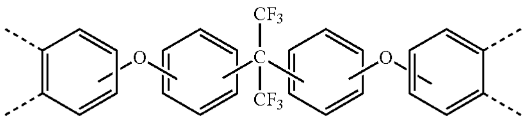

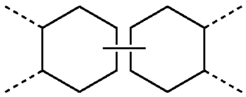

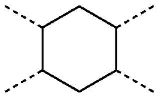

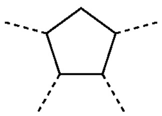

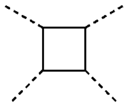

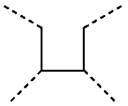

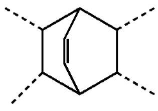

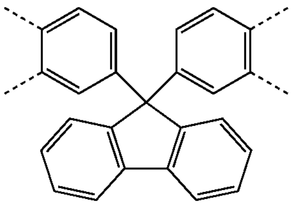

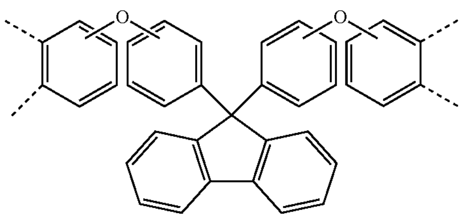

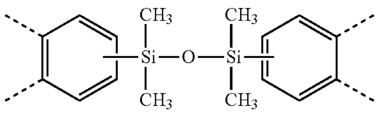

-continued

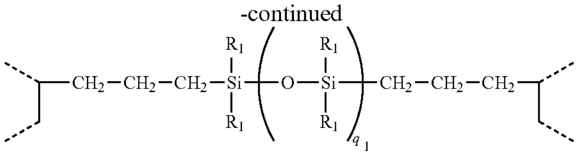

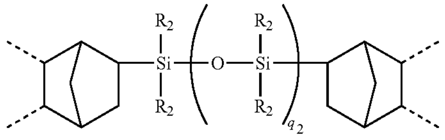

In the formula, $R_1$ and $R_2$ each independently represent a methyl group or a phenyl group. $q_1$ and $q_2$ each represent an integer of 1 to 20. Each dotted line represents a bond.

In the general formula (1), $Z_1$ is a divalent organic group, and this divalent organic group is not limited. $Z_1$ is preferably a divalent organic group having 4 to 40 carbon atoms, more preferably a cyclic organic group containing 1 to 4 aromatic rings or aliphatic rings having a substituent, or an aliphatic group or a siloxane group having no cyclic structure. Examples of further suitable $Z_1$ include a structure represented by the following formula (6):

$$—O—Z_2—O \qquad (6)$$

where $Z_2$ represents a divalent organic group. Each dotted line represents a bond.

In other words, in the inventive polymer, the structural unit represented by the general formula (1) is preferably a structural unit represented by the following general formula (2) (structural unit (2)):

(2)

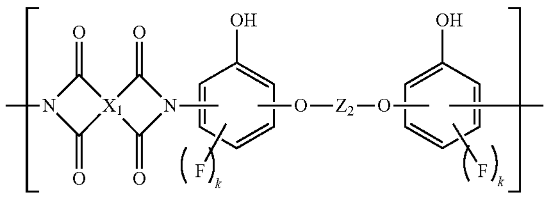

where $Z_2$ represents a divalent organic group. $X_1$ and "k" are as defined above.

In the general formula (6), the divalent organic group as $Z_2$ is not limited, and is preferably a structure shown in the following formula (7). Additionally, the structure of $Z_2$ may be one kind or a combination of two or more kinds.

(7)

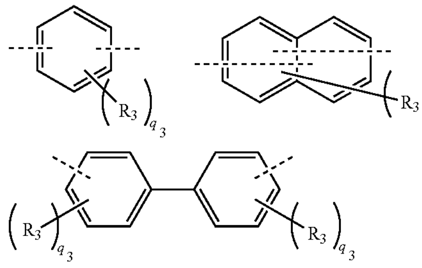

-continued
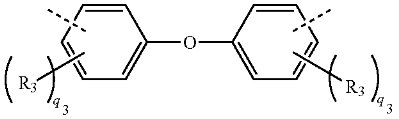
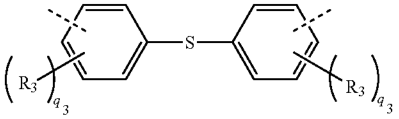
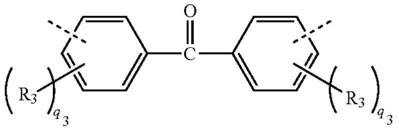
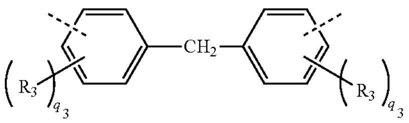
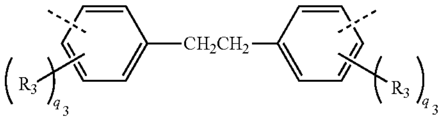
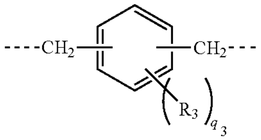
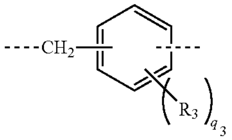
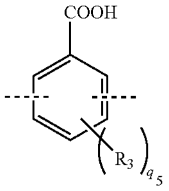
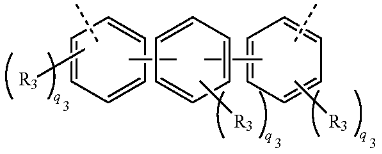
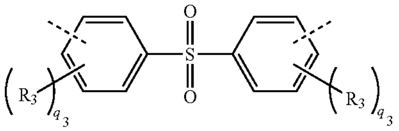
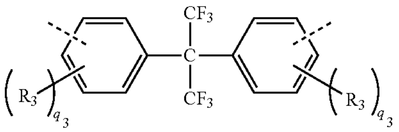
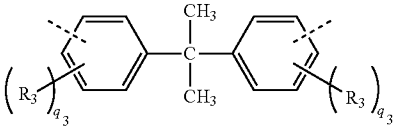
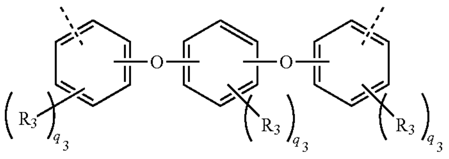
-continued
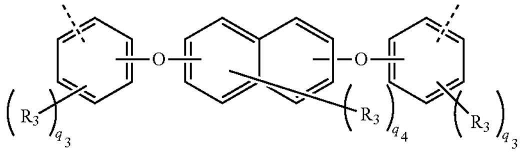
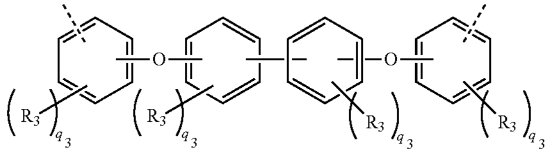
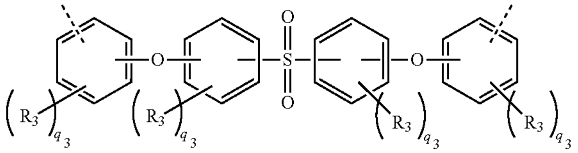
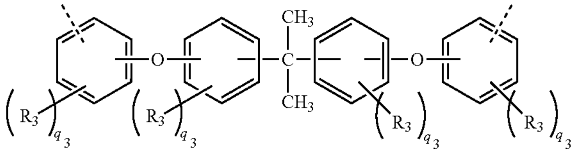
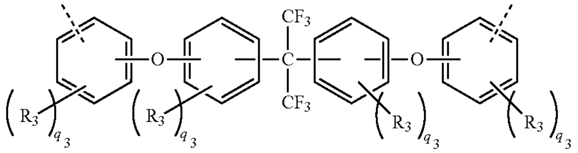
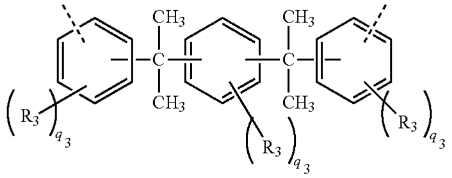
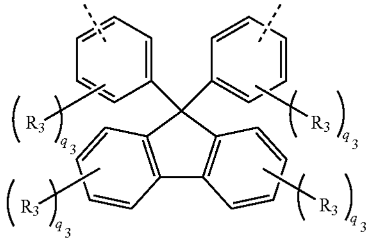
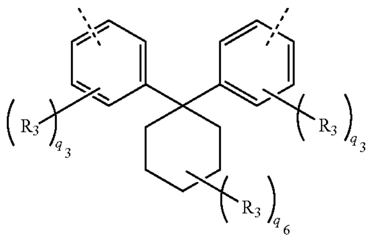
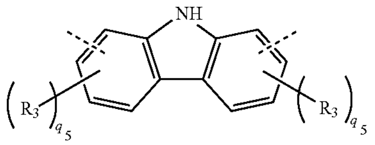

-continued

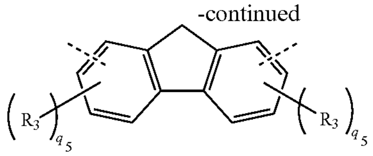

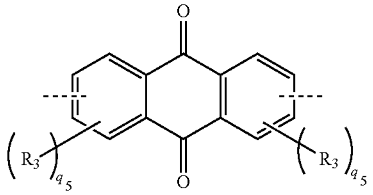

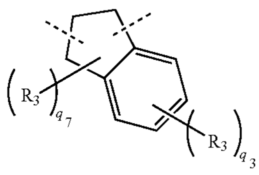

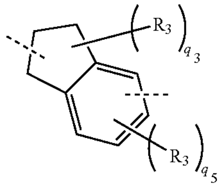

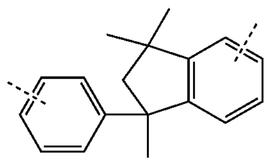

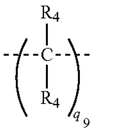

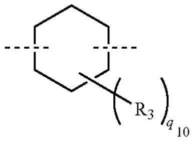

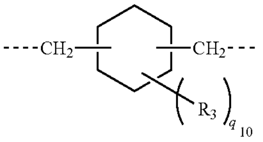

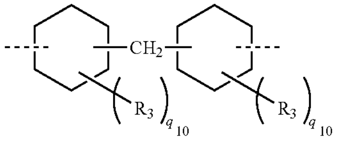

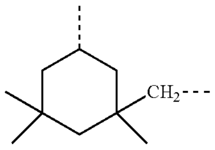

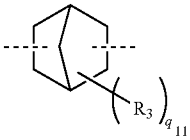

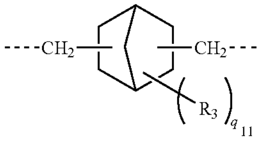

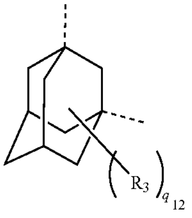

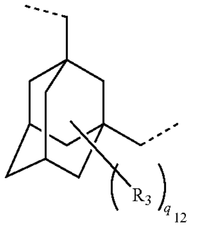

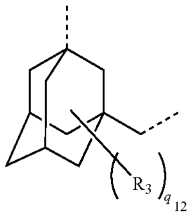

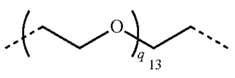

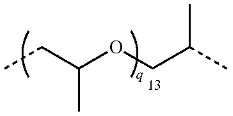

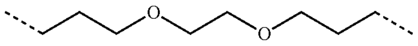

-continued

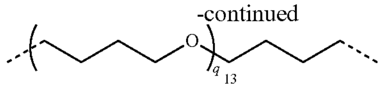

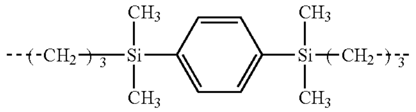

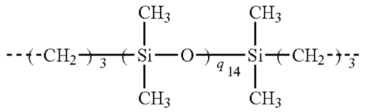

In the formula, $q_3$ represents an integer of 0 to 4. $q_4$ represents an integer of 0 to 6. $q_5$ represents an integer of 0 to 3. $q_6$ represents an integer of 0 to 10. $q_7$ represents 0 or 1. $q_8$ represents an integer of 0 to 2. $q_9$ represents an integer of 1 to 30. $q_{10}$ represents an integer of 0 to 10. $q_{11}$ represents an integer of 0 to 10. $q_{12}$ represents an integer of 0 to 12. $q_{13}$ represents an integer of 0 to 40. $q_{14}$ represents an integer of 1 to 40. $R_3$ represents a fluorine atom, a methyl group, an ethyl group, a propyl group, an n-butyl group, a methoxy group, an ethoxy group, a propoxy group, a butoxy group, or a trifluoromethyl group. When $q_3$ to $q_6$, $q_8$, and $q_{10}$ to $q_{12}$ each represent 2 or more, each $R_3$ may be identical to or different from the other(s). Each $R_4$ independently represents a hydrogen atom, a fluorine atom, or an alkyl group having 1 to 6 carbon atoms. Each dotted line represents a bond.

The resin containing the structural unit represented by the general formula (1) has favorable solubility into an organic solvent and is soluble in an aqueous alkaline solution. Thus, a composition using this resin is capable of forming a fine pattern and achieves high resolution. The resulting cured film has favorable mechanical strength, adhesive force to substrate, and heat resistance. Moreover, the structural unit (1) does not require ring-closing reaction in post-curing, so that the curing reaction temperature can be reduced relatively.

Preferably, the inventive polymer further contains, in addition to the structural unit represented by the general formula (1), a structural unit represented by the following general formula (3) (hereinafter also referred to as structural unit (3)):

(3)

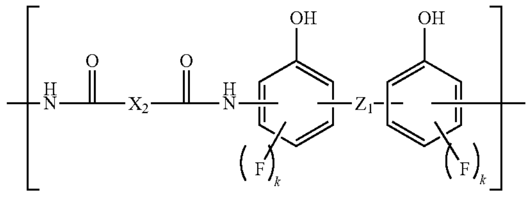

where $X_2$ represents a divalent organic group. $Z_1$ and "k" are as defined above.

In the general formula (3), $X_2$ is a divalent organic group, and this divalent organic group is not limited. Preferably, $X_2$ is a divalent organic group of a long-chain aliphatic structure, an alicyclic aliphatic group, or an aromatic group having 4 to 40 carbon atoms. Further preferably, $X_2$ is a divalent organic group shown in the following formula (8). Additionally, the structure of $X_2$ may be one kind or a combination of two or more kinds.

(8)

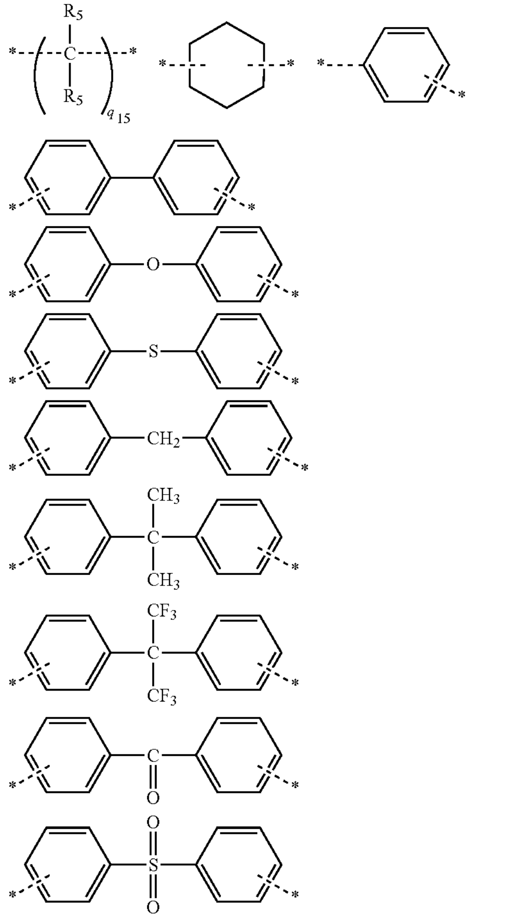

In the formula, each $R_5$ independently represents a hydrogen atom, a fluorine atom, or an alkyl group having 1 to 6 carbon atoms. $q_{15}$ represents an integer of 1 to 30. Each dotted line represents a bond.

The resin containing the structural unit represented by the general formula (3) is preferable because it is possible to enhance the adhesive force to substrate and mechanical properties, such as extensibility, of the cured film obtained by patterning.

Additionally, the inventive polymer may further contain, in addition to the structural units represented by the general formulae (1) to (3), any one or more structural units represented by the following general formulae (9) to (12).

(9)

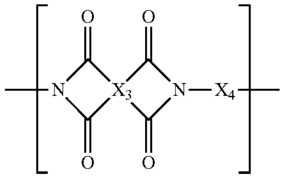

In the formula, $X_3$ represents a tetravalent organic group that is identical to or different from $X_1$. $X_4$ represents a divalent organic group.

(10)

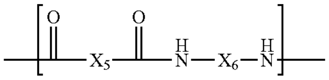

In the formula, $X_5$ represents a divalent organic group that is identical to or different from $X_2$. $X_6$ represents a divalent organic group that is identical to or different from $X_4$.

(11)

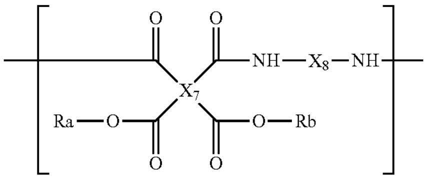

In the formula, $X_7$ represents a tetravalent organic group that is identical to or different from $X_1$. $X_8$ represents a divalent organic group that is identical to or different from $X_4$. Ra and Rb each independently represent a hydrogen atom, or an organic group having 1 to 10 carbon atoms and optionally having a heteroatom therebetween or a substituent.

(12)

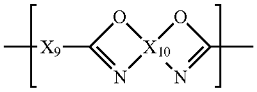

In the formula, $X_9$ represents a divalent organic group that is identical to or different from $X_2$. $X_{10}$ represents a tetravalent organic group.

In the general formula (9), $X_3$ is a tetravalent organic group and may be identical to or different from $X_1$. This tetravalent organic group is not limited. $X_3$ is preferably a tetravalent organic group of an alicyclic aliphatic group or an aromatic group having 4 to 40 carbon atoms, or a tetravalent organic group containing a siloxane skeleton, further preferably a tetravalent organic group shown in the formula (5). Additionally, the structure of $X_3$ may be one kind or a combination of two or more kinds.

In the general formula (9), $X_4$ is a divalent organic group, and this divalent organic group is not limited. $X_4$ is preferably a divalent organic group having 6 to 40 carbon atoms, more preferably a cyclic organic group containing 1 to 4 aromatic rings or aliphatic rings having a substituent, or an aliphatic group or a siloxane group having no cyclic structure. Examples of further suitable $X_4$ include structures shown in the following formula (13), (14) or (15). Additionally, the structure of $X_4$ may be one kind or a combination of two or more kinds.

(13)

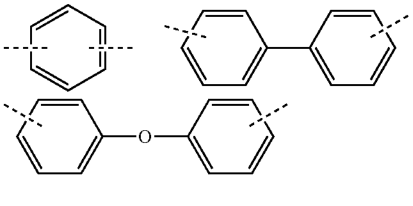

-continued
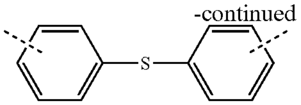
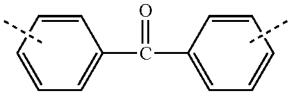
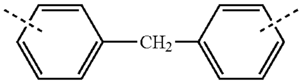
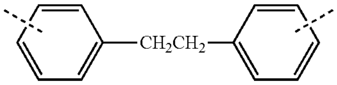
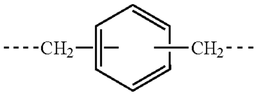
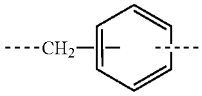
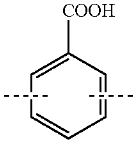
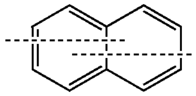
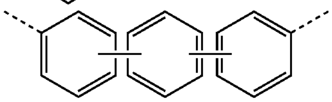
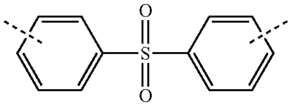
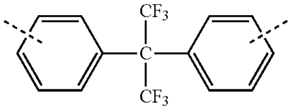
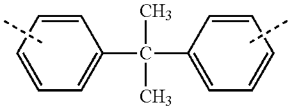
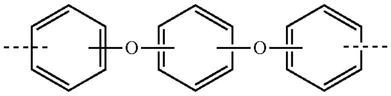
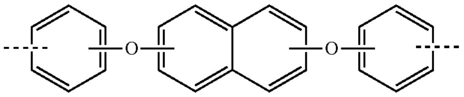
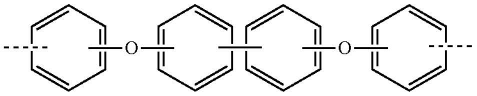
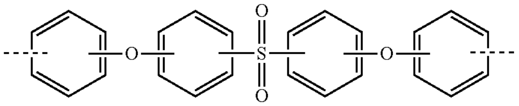
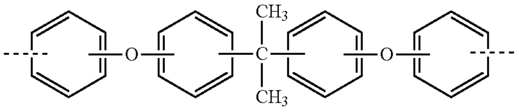
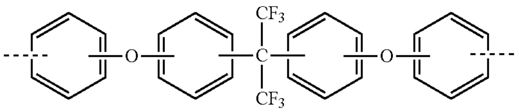
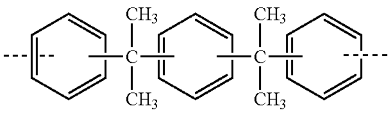
-continued
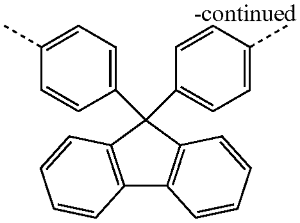
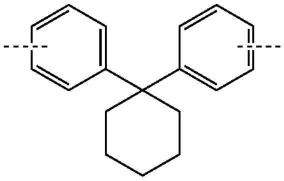
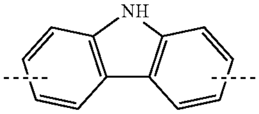
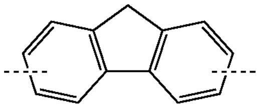
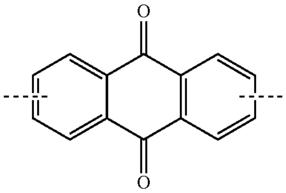
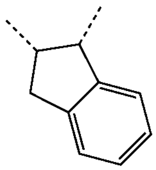
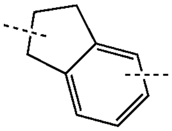
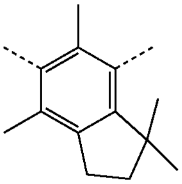
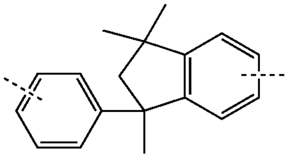
$*-(-CH_2-)_{q_{16}}-*$
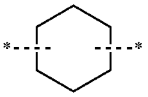
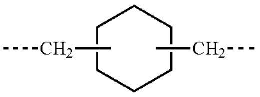
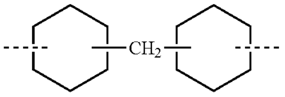
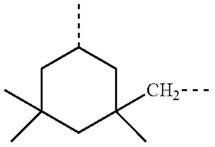
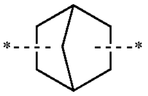
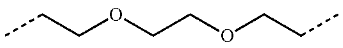
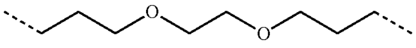
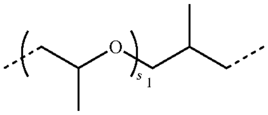
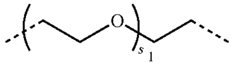
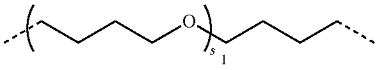
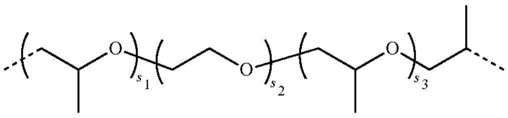

-continued

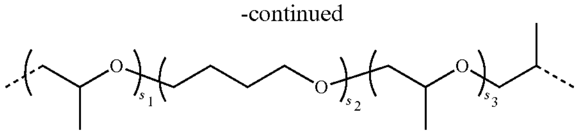

In the formula, $q_{16}$ represents an integer of 1 to 20. Si represents an integer of 1 to 40. $s_2$ and $s_3$ each independently represent an integer of 0 to 40. Each dotted line represents a bond.

(14)

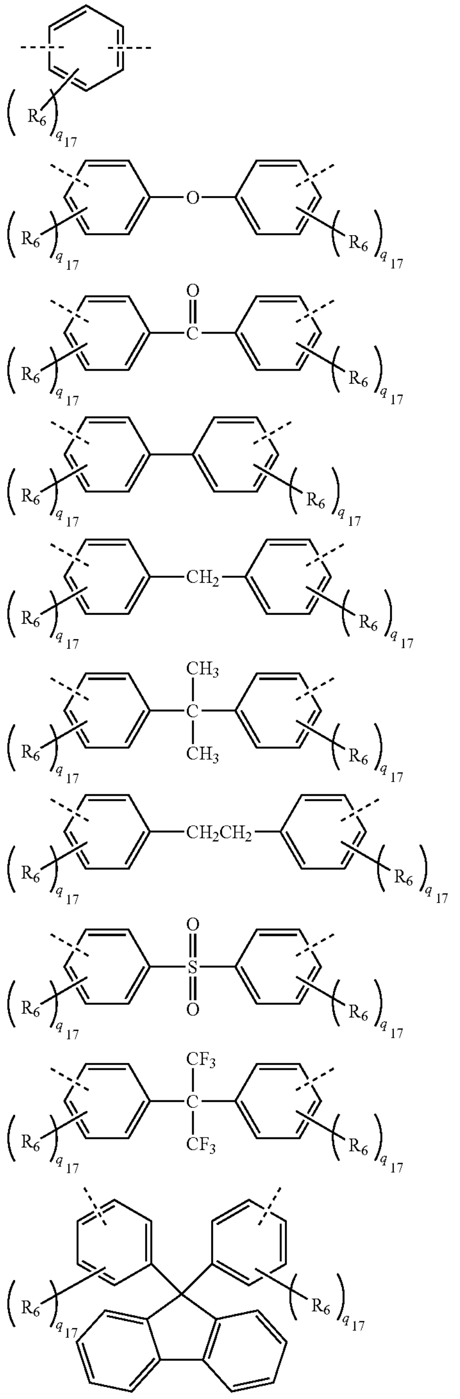

-continued

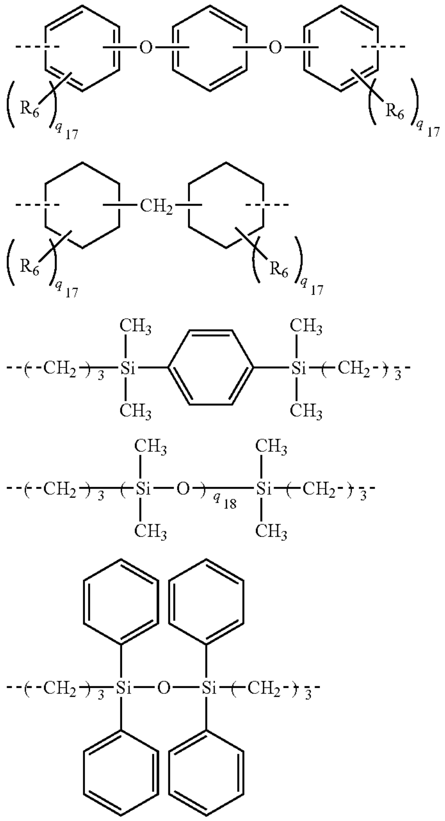

In the formula, $q_{17}$ represents an integer of 1 to 4. $R_6$ represents a fluorine atom, a methyl group, an ethyl group, a propyl group, an n-butyl group, a methoxy group, an ethoxy group, a propoxy group, a butoxy group, or a trifluoromethyl group. When $q_{17}$ is 2 or more, each $R_6$ may be identical to or different from the other(s). $q_{18}$ represents an integer of 1 to 40. Each dotted line represents a bond.

(15)

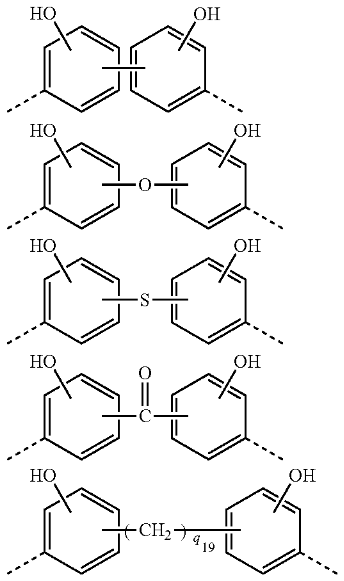

-continued

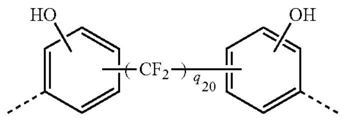

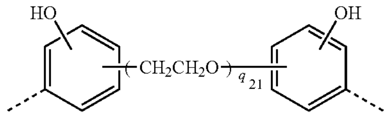

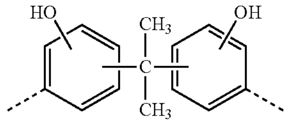

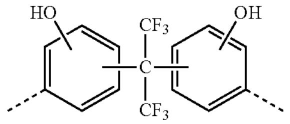

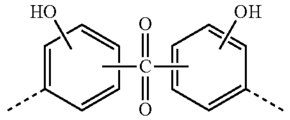

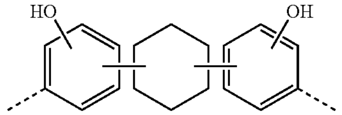

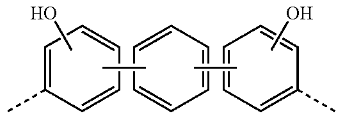

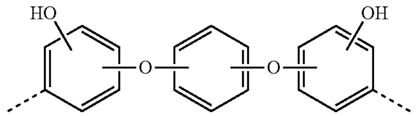

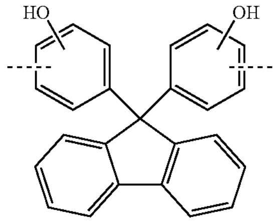

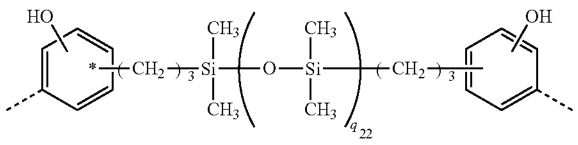

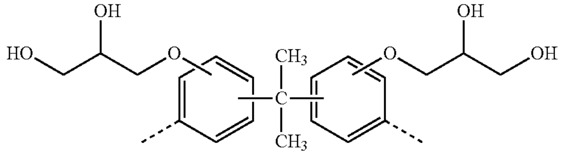

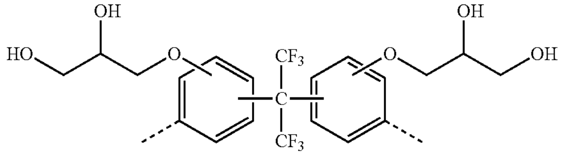

-continued

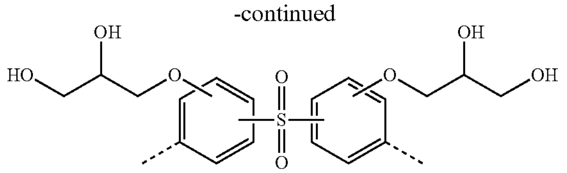

In the formula, $q_{19}$, $q_{20}$, and $q_{21}$ each represent an integer of 1 to 10. $q_{22}$ represents an integer of 1 to 20. Each dotted line represents a bond.

The resin containing the structural unit represented by the general formula (9) is preferable because it is possible to enhance the mechanical strength, adhesive force to substrate, and heat resistance of the cured film obtained by patterning. Moreover, the structural unit (9) does not require ring-closing reaction in post-curing, so that the curing reaction temperature can be reduced relatively, which is preferable.

In the general formula (10), $X_5$ is a divalent organic group and may be identical to or different from $X_2$. This divalent organic group is not limited. Preferably, $X_5$ is a divalent organic group of a long-chain aliphatic structure, an alicyclic aliphatic group, or an aromatic group having 4 to 40 carbon atoms. Further preferably, $X_5$ is a divalent organic group shown in the formula (8). Additionally, the structure of $X_5$ may be one kind or a combination of two or more kinds.

In the general formula (10), $X_6$ is a divalent organic group and may be identical to or different from $X_4$. This divalent organic group is not limited. Preferably, $X_6$ is a divalent organic group having 6 to 40 carbon atoms, a cyclic organic group containing 1 to 4 aromatic rings or aliphatic rings having a substituent, or an aliphatic group or a siloxane group having no cyclic structure. Further preferable examples thereof include structures shown in the formula (13), (14), or (15). Additionally, the structure of $X_6$ may be one kind or a combination of two or more kinds.

The resin containing the structural unit represented by the general formula (10) is preferable because it is possible to enhance the adhesive force to substrate and mechanical properties, such as extensibility, of the cured film obtained by patterning.

In the general formula (11), $X_7$ is a tetravalent organic group and may be identical to or different from $X_1$. This tetravalent organic group is not limited. Preferably, $X_7$ is a tetravalent organic group of an alicyclic aliphatic group or an aromatic group having 4 to 40 carbon atoms, or a tetravalent organic group containing a siloxane skeleton. Further preferably, $X_7$ is a tetravalent organic group shown in the formula (5). Additionally, the structure of $X_7$ may be one kind or a combination of two or more kinds.

In the general formula (11), $X_8$ is a divalent organic group and may be identical to or different from $X_4$. This divalent organic group is not limited. Preferably, $X_8$ is a divalent organic group having 6 to 40 carbon atoms, and is a cyclic organic group containing 1 to 4 aromatic rings or aliphatic rings having a substituent, or an aliphatic group or a siloxane group having no cyclic structure. Further preferable examples thereof include structures shown in the formula (13), (14), or (15). Additionally, the structure of $X_8$ may be one kind or a combination of two or more kinds.

The resin containing the structural unit represented by the general formula (11) is preferable because it is possible to enhance the adhesive force to substrate and mechanical properties, such as extensibility, of the cured film obtained by patterning.

In the general formula (12), $X_9$ is a divalent organic group and may be identical to or different from $X_2$. This divalent organic group is not limited. Preferably, $X_9$ is a divalent organic group of a long-chain aliphatic structure, an alicyclic aliphatic group, or an aromatic group having 4 to 40 carbon atoms. Further preferably, $X_9$ is a divalent organic group shown in the formula (8). Additionally, the structure of $X_9$ may be one kind or a combination of two or more kinds.

In the general formula (12), $X_{10}$ is a tetravalent organic group, and this tetravalent organic group is not limited. $X_{10}$ is preferably a tetravalent organic group having 6 to 40 carbon atoms, more preferably a cyclic organic group containing 1 to 4 aromatic rings or aliphatic rings having a substituent, or an aliphatic group or a siloxane group having no cyclic structure. Examples of further suitable $X_{10}$ include structures shown in the following formula (16). Additionally, the structure of $X_{10}$ may be one kind or a combination of two or more kinds.

(16)

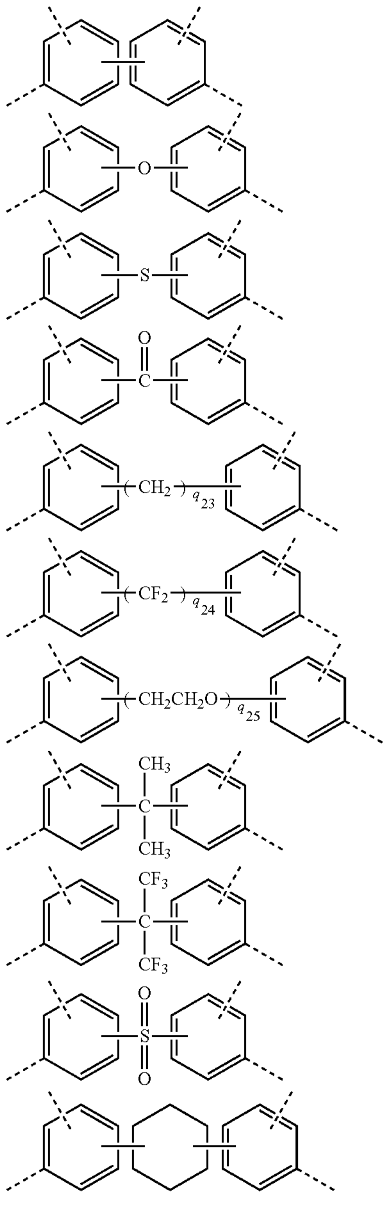

-continued

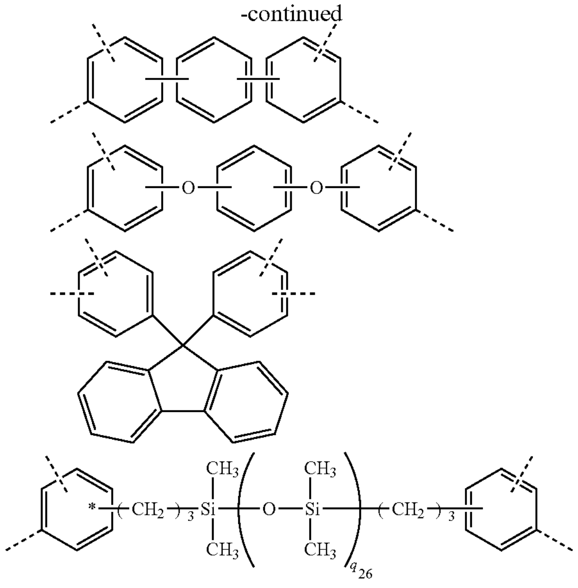

In the formula, $q_{23}$, $q_{24}$, and $q_{25}$ each represent an integer of 1 to 10. $q_{26}$ represents an integer of 1 to 20. Each dotted line represents a bond.

The resin containing the structural unit represented by the general formula (12) is preferable because it is possible to enhance the mechanical strength, adhesive force to substrate, and heat resistance of the cured film obtained by patterning. Moreover, the structural unit (12) does not require ring-closing reaction in post-curing, so that the curing reaction temperature can be reduced relatively, which is preferable.

A suitable weight-average molecular weight of the above-described polymer containing a polyimide structure is preferably 5,000 to 100,000, more preferably 7,000 to 50,000. When the weight-average molecular weight is 5,000 or more, it is easy to make a film of a photosensitive resin composition using the above-described resin as a base resin with a desired film thickness on a substrate. When the weight-average molecular weight is 100,000 or less, the viscosity of such a photosensitive resin composition is not remarkably high, and thus, there is no fear of failing to form a film. Note that, in the present invention, the weight-average molecular weight (hereinafter, also referred to simply as "molecular weight") is a value measured by gel permeation chromatography (GPC) in terms of polystyrene.

[Method for Producing Polymer Containing Polyimide Structure]

The inventive polymer contains a structure represented by the following general formula (1), and preferably contains a structure represented by the following general formula (2).

(1)

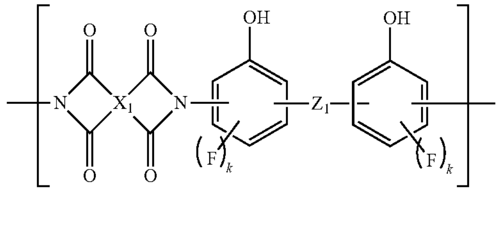

In the formula, $X_1$, $Z_1$ and "k" are as defined above.

(2)

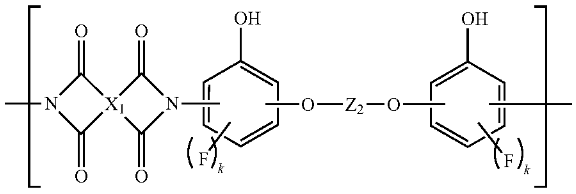

In the formula, $Z_2$ represents a divalent organic group, and $X_1$ and "k" are as defined above.

A polymer containing the structural unit represented by the general formula (1) can be obtained by allowing a tetracarboxylic acid source such as a tetracarboxylic dianhydride to react with a diamine. A polymer containing the structural unit represented by the general formula (2), for example, can be obtained by allowing a tetracarboxylic dianhydride represented by the following general formula (17) to react with a diamine represented by the following general formula (18). At first, an amic acid is synthesized by allowing a tetracarboxylic dianhydride represented by the following general formula (17) to react with a diamine represented by the following general formula (18). Then, an imide ring is formed through thermal dehydration to give a polymer containing the structural unit (2).

The structural unit (2) can be prepared by: dissolving a diamine in a solvent that has a high boiling point and high polarity, such as γ-butyrolactone and N-methyl-2-pyrrolidone; then adding an acid anhydride thereto and carrying out a reaction of the resultant mixture at 0 to 80°, preferably 10 to 50° C., to form an amic acid; then adding a non-polar solvent, such as xylene, thereto; and heating the reaction solution at 100 to 200° C., preferably 130 to 180° C., thereby carrying out imidization reaction while removing water from the reaction system.

(17)

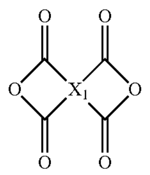

In the formula, $X_1$ is as defined above.

(18)

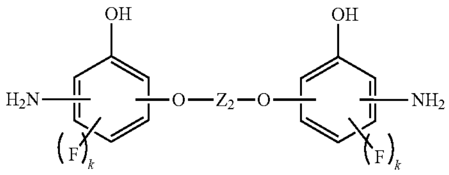

In the formula, $Z_2$ and "k" are as defined above.

Suitable examples of the tetracarboxylic dianhydride represented by the general formula (17) include aromatic acid dianhydrides, alicyclic acid dianhydrides, aliphatic acid dianhydrides, siloxane skeleton-containing dianhydrides, etc. Examples of the aromatic acid dianhydride include, but are not limited to, for example, pyromellitic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl) ethane dianhydride, bis(3,4-dicarboxyphenyl)methane dianhydride, bis(2,3-dicarboxyphenyl)methane dianhydride, 1,4-(3,4-dicarboxyphenoxy)benzene dianhydride, p-phenylenebis (trimellitic acid monoester acid anhydride), bis(1,3-dioxo-1,3-dihydroisobenzfuran-5-carboxylic acid)1,4-phenylene, 2,2-bis(4-(4-aminophenoxy)phenyl)propane, 1,2,5,6-naphthalenetetracarboxylic dianhydride, 2,3,6,7-naphthalenetetracarboxylic dianhydride, 9,9-bis(3,4-dicarboxyphenyl) fluorene dianhydride, 9,9-bis(4-(3,4-dicarboxyphenoxy) phenyl)fluorene dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropyromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis [(dicarboxyphenoxy)phenyl]propane dianhydride, 2,2'-bis [(dicarboxyphenoxy)phenyl]hexafluoropropane dianhydride, and acid dianhydride compounds formed by substituting aromatic rings of the above compounds with an alkyl group, an alkoxy group, a halogen atom, or the like.

Examples of the alicyclic acid dianhydride include, but are not limited to, for example, 1,2,3,4-cyclobutanetetracarboxylic dianhydride, 1,2,3,4-cyclopentanetetracarboxylic dianhydride, 1,2,4,5-cyclohexanetetracarboxylic dianhydride, 1,2,4,5-cyclopentanetetracarboxylic dianhydride, 1,2,3,4-tetramethyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetrahydro-1-naphthalenesuccinic dianhydride, bicyclo[3.3.0]octane-2,4,6,8-tetracarboxylic dianhydride, bicyclo[4.3.0]nonane-2,4,7,9-tetracarboxylic dianhydride, bicyclo[4.4.0]decane-2,4,7,9-tetracarboxylic dianhydride, bicyclo[4.4.0]decane-2,4,8,10-tetracarboxylic dianhydride, tricycle[6.3.0.$0^{2,6}$]undecane-3,5,9,11-tetracarboxylic dianhydride, bicyclo[2.2.2]octane-2,3,5,6-tetracarboxylic dianhydride, bicyclo[2.2.2]oct-7-ene-2,3,5,6-tetracarboxylic dianhydride, bicyclo[2.2.1]heptanetetracarboxylic dianhydride, bicyclo[2.2.1]heptane-5-carboxymethyl-2,3,6-tricarboxylic dianhydride, 7-oxabicyclo[2.2.1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, 5-(2,5-dioxotetrahydro-3-furanyl)-3-methyl-3-cyclohexene-1,2-dicarboxylic anhydride, and "RIKACID" (Registered Trademark) BT-100 (trade name, manufactured by New Japan Chemical Co., Ltd.) and derivatives thereof, or acid dianhydride compounds formed by substituting aliphatic rings of the above compounds with an alkyl group, an alkoxy group, a halogen atom or the like.

Examples of the aliphatic acid dianhydride include, but are not limited to, for example, 1,2,3,4-butanetetracarboxylic dianhydride, 1,2,3,4-pentanetetracarboxylic dianhydride, and derivatives thereof.

Examples of the siloxane skeleton-containing dianhydride include, but are not limited to, for example, 1,3-bis(3,4-dicarboxyphenyl)-1,1,3,3-tetramethyldisiloxane dianhydride, 3,3'-((1,1,3,3-tetramethyl-1,3-disiloxanediyl)di-3,1-propanediyl)bis(dihydro-2,5-furandione), and derivatives thereof.

Any one of these aromatic acid dianhydrides, alicyclic acid dianhydrides, aliphatic acid dianhydrides, or siloxane skeleton-containing dianhydrides may be used singly, or two or more thereof may be used in combination.

A method of producing a diamine compound represented by the general formula (18) is not particularly limited. Examples thereof includes a process in which a nitrophenol compound represented by the following general formula (19) and a dihydroxy compound represented by the following general formula (20) are subjected to nucleophilic aromatic substitution in an organic solvent in the presence of a basic catalyst such as potassium carbonate, thereby obtaining a dinitro compound represented by the following general formula (21), and a process in which the nitro groups are then reduced.

(19)

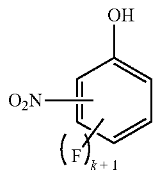

In the formula, "k" is as defined above.

$$HO—Z_2—OH \quad (20)$$

In the formula, $Z_2$ is as defined above.

(21)

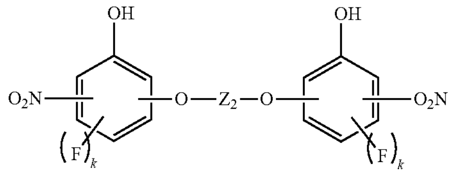

In the formula, $Z_2$ and "k" are as defined above.

The organic solvent to be used in the nucleophilic aromatic substitution is not particularly limited, as long as the solvent does not affect the reaction. It is possible to use aromatic hydrocarbons, such as benzene, toluene and xylene; aliphatic hydrocarbons, such as n-hexane, n-heptane and cyclohexane; amides, such as N,N-dimethylformamide, N,N-dimethylacetamide and N-methyl-2-pyrrolidone; ethers, such as diethyl ether, tetrahydrofuran, 1,4-dioxane, 1,2-dimethoxyethane and cyclopentyl methyl ether; ketones, such as 2-butanone and 4-methyl-2-pentanone; nitriles, such as acetonitrile; dimethylsulfoxide; halogenated hydrocarbons, such as chloroform, dichloromethane and dichloroethane; esters, such as ethyl acetate, methyl acetate and butyl acetate; etc. Any one of these solvents may be used singly, or two or more thereof may be used in combination. Note that, if a large amount of water is included in the solvent, undesired side reaction may occur. Thus, it is preferable that a dehydrated solvent be used as the solvent or dehydration be carried out before using the solvent.

It is sufficient that the reaction temperature be the boiling point of the solvent or lower. The reaction temperature can be approximately 0 to 200° C., preferably 0 to 100° C.

Examples of the basic catalyst used in the above-described reaction may include trialkylamines, such as triethylamine, tributylamine and N,N-dimethylcyclohexylamine; aliphatic cyclic tertiary amines, such as N-methylmorpholine; aromatic amines, such as N,N-dimethylaniline and triphenylamine; heterocyclic amines, such as pyridine, picoline, lutidine, quinoline and N,N-dimethyl-4-aminopyridine; carbonates or bicarbonates of alkaline metals or alkali earth metals, such as sodium carbonate and potassium carbonate; and alkaline metal salts, such as potassium t-butoxide and sodium hydride. Preferable examples are carbonates or bicarbonates of alkaline metals or alkali earth metals, such as sodium carbonate and potassium carbonate. Any one of these basic catalysts may be used singly, or two or more thereof may be used in combination.

For the process of reducing the nitro groups in the general formula (21), any known reduction method may be employed and there is no particular limitation thereon. An exemplary process thereof includes a reduction process carried out with a catalyst such as palladium-carbon, platinum oxide, Raney nickel, platinum-carbon, rhodium-alumina, platinum sulfide-carbon, reduced iron, iron chloride, tin, tin chloride, and zinc, and by using hydrogen gas, hydrazine, hydrogen chloride, ammonium chloride, or the like as a hydrogen atom source. In particular, catalytic hydrogenation is preferable because it is unlikely to cause side reactions and can readily provide the target product. In addition, the amount of the catalyst to be used is not particularly limited because it is determined appropriately depending on the type of hydrogen source or reaction conditions. The catalyst amount in terms of metal is normally 0.01 mol % to 50 mol %, and preferably 0.1 mol % to 20 mol %, relative to the dinitro compound.

As the reaction solvent for the above-described reduction reaction, a solvent that does not affect the reaction can be used. Examples thereof include ester solvents, such as ethyl acetate and methyl acetate; aromatic hydrocarbon solvents, such as toluene and xylene; aliphatic hydrocarbon solvents, such as n-hexane, n-heptane and cyclohexane; ether solvents, such as 1,2-dimethoxyethane, tetrahydrofuran and dioxane; alcohol solvents, such as methanol and ethanol; ketone solvents, such as 2-butanone and 4-methyl-2-pentanone; aprotic polar solvents, such as N,N-dimethylformamide, N,N-dimethylacetamide, N-methyl-2-pyrrolidone and dimethylsulfoxide; water; etc. One of these solvents may be used singly, or two or more thereof may be used in combination.

The reaction temperature for the reduction reaction is preferably 0 to 100° C. and more preferably 10 to 50° C. In addition, the catalytic hydrogenation may be carried out under a pressurized condition, using an autoclave or the like, from the viewpoints of improving the reaction rate, allowing the reaction at low temperature, etc.

Suitable examples of the nitrophenol compound represented by the general formula (19) include, but are not limited to, 2,3-difluoro-4-nitrophenol, 2,3-difluoro-5-nitrophenol, 2,3-difluoro-6-nitrophenol, 2,4-difluoro-5-nitrophenol, 2,4-difluoro-3-nitrophenol, 2,4-difluoro-6-nitrophenol, 2,5-difluoro-4-nitrophenol, 2,5-difluoro-3-nitrophenol, 2,5- difluoro-6-nitrophenol, 2,6-difluoro-4-nitrophenol, 2,6-difluoro-3-nitrophenol, 3,4-difluoro-2-nitrophenol, 3,4-difluoro-5-nitrophenol, 3,4-difluoro-6-nitrophenol, 3,5-difluoro-2-nitrophenol, 3,5-difluoro-4-nitrophenol, 2,3,4-trifluoro-5-nitrophenol, 2,3,4-trifluoro-6-nitrophenol, 2,3,5-trifluoro-4-nitrophenol, 2,3,5-trifluoro-6-nitrophenol, 2,3,6-trifluoro-4-nitrophenol, 2,3,6-trifluoro-5-nitrophenol, 2,4,5-trifluoro-3-nitrophenol, 2,4,5-trifluoro-6-nitrophenol, 2,4,6-trifluoro-3-nitrophenol, 2,3,4,5-tetrafluoro-6-nitrophenol, 2,3,4,6-tetrafluoro-5-nitrophenol, 2,3,5,6-tetrafluoro-4-nitrophenol, etc.

Suitable examples of the dihydroxy compound represented by the general formula (20) include, but are not limited to, catechol, resorcinol, hydroquinone, 4-fluorocatechol, 5-fluororesorcinol, tetrafluorohydroquinone, 1,5-dihydroxynaphthalene, 2,6-dihydroxynaphthalene, 4,4'-biphenol, octafluoro-4,4'-biphenol, 4,4'-dihydroxydiphenyl ether, bis(4-hydroxyphenyl)sulfide, 4,4'-dihydroxybenzophenone, 4,4'-dihydroxydiphenylmethane, 1,4-benzenedimethanol, 4-hydroxybenzyl alcohol, 2,5-dihydroxybenzoic acid, bis(4-hydroxyphenyl)sulfone, 2,2-bis(4-hydroxyphenyl)propane, 2,2-bis(4-hydroxyphenyl)hexafluoropropane, 1,4-bis(4-hydroxyphenoxy)benzene, 4,4'-(2,6-naphthalenediylbis(oxy))bisphenol, 4,4'-(1,1'-biphenyl)-4,4'-diylbis(oxy))bisphenol, 4,4'-bis(4-hydroxyphenoxy)diphenylsulfone, 2,2'-bis(4-(4-hydroxyphenoxy)phenyl)propane, 2,2'-bis(4-(4-hydroxyphenoxy)phenyl)hexafluoropropane, 1,4-bis(2-(4-hydroxyphenyl)-2-propyl)benzene, 9,9'-bis(4-hydroxyphenyl)fluorene, 1,1'-bis(4-hydroxyphenyl)cyclohexane, 9H-carbazole-2,7-diol, fluorene-2,7-diol, 2,7-dihydroxy-9,10-anthracenedione, 2,3-dihydro-1H-indene-1,2-diol, 2,3-dihydro-1H-indene-2,5-diol, 2,3-dihydro-1-(4-hydroxyphenyl)-1,3,3-trimethyl-1H-indene-5-ol, 1,6-hexanediol, 1,10-decanediol, 1,4-cyclohexanediol, 1,4-cyclohexanedimethanol, 4,4'-methylenebis(cyclohexanol), 5-hydroxy-1,3,3-trimethylcyclohexanemethanol, bicyclo(2,2,1)heptane-2,5-diol, bicyclo(2,2,1)heptane-2,5-dimethanol, 1,3-adamantanediol, 3-(hydroxymethyl)-1-adamantanol, 1,3-adamantanedimethanol, diethylene glycol, triethylene glycol, dibutylene glycol, 2-(2-(2-hydroxypropoxy)propoxy)-1-propanol, 3,3'-(1,2-ethanediylbis(oxy))bis-1-propanol, 3,3'-(1,4-phenylenebis(dimethylsilylene))bis-1-propanol, 3,3'-(1,1,3,3-tetramethyl-1,3-disiloxanediyl)bis-1-propanol, etc.

Meanwhile, as described above, the inventive polymer may further contain, in addition to the structural unit represented by the general formula (1), the following structural unit (3), and preferably may contain the following structural unit (4):

(3)

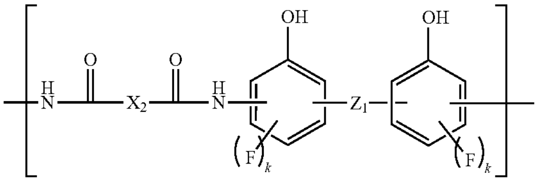

where $X_2$, $Z_1$ and "k" are as defined above, and (4)

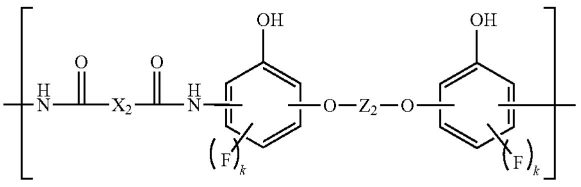

where $X_2$, $Z_2$ and "k" are as defined above.

A polymer containing a structural unit represented by the general formula (3) can be obtained by a reaction of a dicarboxylic acid source such as a dicarboxylic acid compound with a diamine. A polymer containing a structural unit represented by the general formula (4), for example, can be obtained by a reaction of a dicarboxylic acid compound represented by the following general formula (22) with a diamine represented by the general formula (18):

(22)

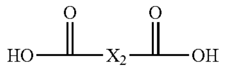

where $X_2$ is as defined above.

Here, the polymer containing the structural unit (4) can be obtained by, for example, reacting a dicarboxylic acid compound represented by the general formula (22) with a diamine represented by the general formula (18) in the presence of a dehydration condensation agent. That is, the polymer containing the structural unit (4) can be obtained by using the dicarboxylic acid compound represented by the general formula (22) for the reaction in the state of being dissolved in a reaction solvent; adding into this reaction solution a known dehydration condensation agent (for example, dicyclohexylcarbodiimide, 1-ethoxycarbonyl-2-ethoxy-1,2-dihydroquinoline, 1,1-carbonyldioxy-di-1,2,3-benzotriazole, N,N'-disuccinimidyl carbonate or the like) and mixing the resultant mixture under ice cooling to make the dicarboxylic acid compound represented by the general formula (22) into an acid anhydride; and then adding dropwise to this the diamine represented by the general formula (18) that has been dissolved or dispersed in a solvent separately to carry out the polycondensation.

In addition, examples of other methods of obtaining the polymer containing the structural unit (4) by reacting the dicarboxylic acid compound represented by the general formula (22) with the diamine (diamine compound) represented by the general formula (18) include a process in which the polymer is synthesized by converting the dicarboxylic acid compound represented by the general formula (22) into an acid chloride with using a chlorinating agent such as thionyl chloride or oxalyl chloride, and reacting the acid chloride with the diamine represented by the general formula (18).

In the reaction in which the dicarboxylic acid compound is converted into an acid chloride with using a chlorinating agent, a basic compound may be further used. For this basic compound, for example, pyridine, N,N-dimethyl-4-aminopyridine, triethylamine, or the like can be used.

Then, by reacting the obtained acid chloride of the dicarboxylic acid compound with the diamine represented by the general formula (18) in the presence of a basic catalyst, the target polymer containing the structural unit (4) can be obtained. Upon this, examples of the basic catalyst include pyridine, N,N-dimethyl-4-aminopyridine, 1,8-diazabicyclo [5.4.0]undec-7-ene, 1,5-diazabicyclo[4.3.0]non-5-ene, etc. Any one of these basic catalysts may be used singly, or two or more thereof may be used in combination.

In the method of producing the inventive polymer, the preferable solvent to be used in the process through the acid chloride well dissolves the above-described dicarboxylic acid compound and an acid chloride thereof, as well as the polymer obtained through the polycondensation of them with the diamine. Specific examples thereof include polar solvents, such as N-methyl-2-pyrrolidone, N,N-dimethylacetamide, N,N-dimethylformamide, dimethylsulfoxide, tetramethylurea, hexamethylphosphoric triamide and γ-butyrolactone. In addition, other than polar solvents, ketones, esters, lactones, ethers, halogenated hydrocarbons, hydrocarbons and the like can also be used. Examples thereof include acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, xylene, etc. Any one of these organic solvents may be used singly, or two or more thereof may be used in combination.

Suitable examples of $X_2$ in the dicarboxylic acid compound represented by the general formula (22) may include the same examples as those mentioned above.

In addition, examples of the dicarboxylic acid compound represented by the general formula (22) include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, 2-methyladipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, etc.

Further, examples of the dicarboxylic acid compound having an aromatic ring include, but are not limited to phthalic acid, isophthalic acid, terephthalic acid, 4,4'-diphenyl ether dicarboxylic acid, 3,4'-diphenyl ether dicarboxylic acid, 3,3'-diphenyl ether dicarboxylic acid, 4,4'-biphenyldicarboxylic acid, 3,4'-biphenyldicarboxylic acid, 3,3'-biphenyldicarboxylic acid, 4,4'-benzophenonedicarboxylic acid, 3,4'-benzophenonedicarboxylic acid, 3,3'-benzophenonedicarboxylic acid, 4,4'-hexafluoroisopropylidenedibenzoic acid, 4,4'-dicarboxydiphenylamide, 1,4-phenylenediethanoic acid, bis(4-carboxyphenyl)sulfide, 2,2-bis(4-carboxyphenyl)-1,1,1,3,3,3-hexafluoropropane, bis(4-carboxyphenyl)tetraphenyldisiloxane, bis(4-carboxyphenyl) tetramethyldisiloxane, bis(4-carboxyphenyl)sulfone, bis(4-carboxyphenyl)methane, 5-tert-butylisophthalic acid, 5-bromoisophthalic acid, 5-fluoroisophthalic acid, 5-chloroisophthalic acid, 2,2-bis-(p-carboxyphenyl)propane, and 2,6-naphthalenedicarboxylic acid, etc. In addition, they may be used singly or mixed for use.

(Molecular Weight of Polymer and Introduction of End-Capping Agent)

A suitable molecular weight of the above-mentioned alkaline soluble resin is preferably 5,000 to 100,000 and more preferably 7,000 to 50,000. When the molecular weight is 5,000 or more, it becomes easy to make a film of a photosensitive resin composition using the above-described alkaline soluble resin as a base resin with a desired film thickness on a substrate. When the molecular weight is 100,000 or less, the viscosity of such a photosensitive resin composition is not remarkably high, and thus, there is no fear of failing to form a film.

The above-mentioned alkaline soluble resin may be capped at both ends with an end-capping agent for the purposes of controlling the molecular weight in the polycondensation reaction and preventing temporal change in the molecular weight of the obtained polymer, that is, gelation. Examples of an end-capping agent that reacts with an acid dianhydride include monoamines, monohydric alcohols, etc. In addition, examples of an end-capping agent that reacts with a diamine compound include acid anhydrides, monocarboxylic acids, monoacid chloride compounds, monoactive ester compounds, dicarbonate esters, vinyl ethers, etc. In addition, by reacting with an end-capping agent, a variety of organic groups can be introduced as end group.

Examples of the monoamine to be used as the capping agent for the acid anhydride group terminal include, but are not limited to, aniline, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, 4,8-diethynyl-2-aminonaphthalene, 4-fluoroaniline, 3-fluoroaniline, 2-fluoroaniline, 2,4-difluoroaniline, 3,4-difluoroaniline, 2,4,6-trifluoroaniline, 2,3,4-trifluoroaniline, pentafluoroaniline, etc. One of these monoamines may be used singly, or two or more thereof may be used in combination.

Meanwhile, examples of the monohydric alcohol to be used as the capping agent for the acid anhydride group terminal include, but are not limited to, methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-icosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononyl alcohol, 3,7-dimethyl-3-octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentanemonomethylol, dicyclopentanemonomethylol, tricyclodecanemonomethylol, norborneol, terpineol, etc. One of these may be used singly, or two or more thereof may be used in combination.

Examples of the acid anhydride, monocarboxylic acid, monoacid chloride compound and mono-active ester compound to be used as the capping agent for the amino group terminal include acid anhydrides, such as phthalic anhydride, maleic anhydride, nadic anhydride, cyclohexanedicarboxylic anhydride and 3-hydroxyphthalic anhydride; monocarboxylic acids, such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid and 8-ethynyl-2-naphthoic acid, and monoacid chloride compounds in which the carboxyl group of the above monocarboxylic acids is acid-chlorinated; monoacid chloride compounds of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene and 2,7-dicarboxynaphthalene, in which only a monocarboxyl group is acid-chlorinated; and active ester compounds obtained through reaction between monoacid chloride compounds and N-hydroxybenzotriazole or N-hydroxy-5-norbornene-2,3-dicarboxyimide.

Examples of the dicarbonate ester compound to be used as the capping agent for the amino group terminal include di-tert-butyl dicarbonate, dibenzyl dicarbonate, dimethyl dicarbonate, diethyl dicarbonate, etc.

Examples of the vinyl ether compound to be used as the capping agent for the amino group terminal include butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, benzyl vinyl ether, etc.

Examples of another compound to be used as the capping agent for the amino group terminal include benzoyl chloride; chloroformate esters such as fluorenylmethyl chloroformate, 2,2,2-trichloroethyl chloroformate, tert-butyl chloroformate, n-butyl chloroformate, isobutyl chloroformate, benzyl chloroformate, allyl chloroformate, ethyl chloroformate and isopropyl chloroformate; isocyanate compounds such as butyl isocyanate, 1-naphthyl isocyanate, octadecyl isocyanate and phenyl isocyanate; methanesulfonic acid chloride and p-toluenesulfonic acid chloride, etc.

The proportion of the capping agent to be introduced for the acid anhydride group terminal is preferably in the range of 0.1 to 60 mol %, particularly preferably 5 to 50 mol %, and further preferably 5 to 20 mol % relative to the tetracarboxylic dianhydride component corresponding to the above-described general formula (17), which is a raw material of the inventive polymer. Moreover, the proportion of the capping agent to be introduced for the amino group terminal is preferably in the range of 0.1 to 100 mol % and particularly preferably 5 to 90 mol % relative to the diamine component. Moreover, by reacting with a plurality of end-capping agents, a plurality of different end groups may be introduced.

[Photosensitive Resin Composition]

Next, a photosensitive resin composition using the inventive polymer as a base resin will be described. In the present invention, by using the above-mentioned inventive polymer as a base resin, a positive photosensitive resin composition and a negative photosensitive resin composition can be obtained.

[Positive Photosensitive Resin Composition]

First, among photosensitive resin compositions using the inventive polymer as a base resin, a positive photosensitive resin composition capable of alkaline development will be described. The positive photosensitive resin composition according to the present invention can be taken, for example, two embodiments as described below, but is not limited to them.

The first embodiment of the inventive positive photosensitive resin composition contains:

(A) a polymer containing the structural unit (1), or a polymer containing the structural units (1) and (3);

(B) a photosensitizer which is a compound having a quinonediazide structure and generates an acid by light to increase a dissolution rate in an aqueous alkaline solution; and (D) a solvent.

The polymer as the component (A) containing the structural unit (1), or the structural units (1) and (3), in the inventive positive photosensitive resin composition contains, as mentioned above, phenolic hydroxy groups each having at least one fluorine atom as substituent. Because of the electron-withdrawing property of the fluorine atoms, the acidity of the phenolic hydroxy groups is increased. Thus, a desired alkaline dissolution rate is achieved with a developing solution of an aqueous alkaline solution, and there is no fear of: failure in the pattern opening upon patterning, scum observation at the bottom of the pattern, and resolution reduction. Moreover, the solvent solubility of the polymer is enhanced by the effect of the fluorine atoms to suppress the intermolecular interaction.

In the inventive positive photosensitive resin composition, the component (B) is a photosensitizer which generates an acid by light to increase a dissolution rate in an aqueous alkaline solution, and is a compound having a quinonediazide structure. Examples of the component (B) may include compounds having a 1,2-naphthoquinonediazidosulfonyl group in the molecules.

Examples of the compounds having a 1,2-naphthoquinonediazidosulfonyl group in the molecules include compounds having a 1,2-naphthoquinonediazidosulfonyl group represented by the following general formula (23) or (24) in the molecules.

(23)

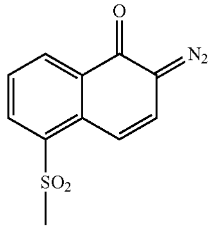

(24)

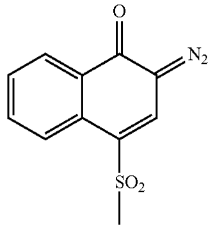

As a compound to which the above-described 1,2-naphthoquinonediazidosulfonyl group is introduced, specifically, trihydroxybenzophenone or tetrahydroxybenzophenone, a ballast molecule having a phenolic hydroxy group represented by the following general formula (25), or a novolac resin having a repeating unit represented by a formula (30) described later with a weight-average molecular weight in the range of 2,000 to 20,000, preferably 3,000 to 10,000, is suitably used. That is, those formed by replacing the hydrogen atom of phenolic hydroxy group of the resin or compound having phenolic hydroxy groups, which will be mentioned below, with the above-described 1,2-naphthoquinonediazidosulfonyl groups are suitably used as the component (B).

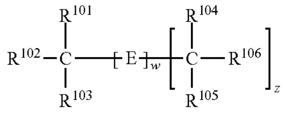

(25)

Here, $R^{101}$ to $R^{106}$ are each independently a hydrogen atom, a methyl group, a group represented by the following formula (26), or a group represented by the following formula (27). "w" is an integer of 0 to 2, "z" is an integer of 0 to 2, and when "z" is 0, "w" is 1 or 2. When "z" is 0 and "w" is 1, E is a hydrogen atom, a methyl group or a group represented by the following formula (26); when "z" is 0 and "w" is 2, one E is a methylene group or a group represented by the following formula (28), and the other E is a hydrogen atom, a methyl group or a group represented by the following formula (26); and when "z" is 1, E is a methylene group or a group represented by the following formula (28). In the case of "z" being 2, when "w" is 1, E is a methine group or a group represented by the following formula (29); and when "w" is 2, one of the Es is a methylene group or a group represented by the following formula (28), and the other E is a methine group or a group represented by the following formula (29).

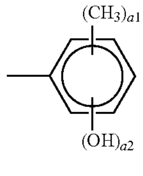

(26)

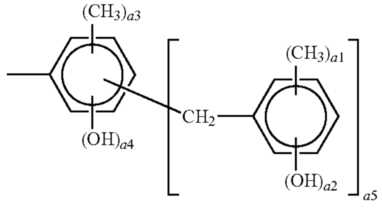

(27)

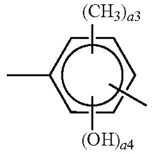

(28)

-continued (29)

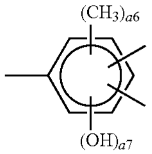

In the formulae, a1, a2, a3, a4, a5, a6, and a7 each represent an integer of 0 to 3, provided that a1+a2≤5, a3+a4≤4, and a6+a7≤3.

In this case, in a low nuclide (ballast molecule) of the formula (25), the number of benzene rings is suitably 2 to 20, more preferably 2 to 10, further preferably 3 to 6. Simultaneously, the ratio between the number of phenolic hydroxy groups and the number of benzene rings is suitably 0.5 to 2.5, more preferably 0.7 to 2.0, further preferably 0.8 to 1.5.

Specific examples of such a low nuclide (ballast molecule) include the following.

(B-1)

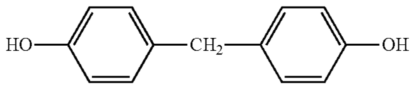

(B-2)

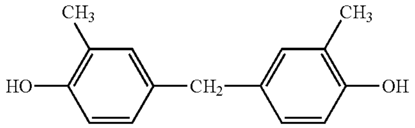

(B-3)

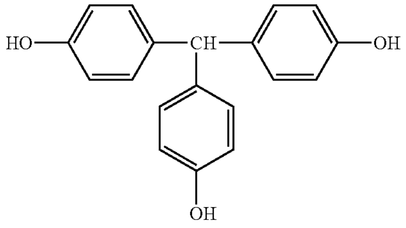

(B-4)

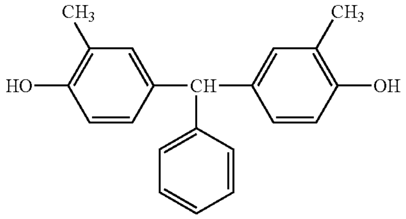

(B-5)

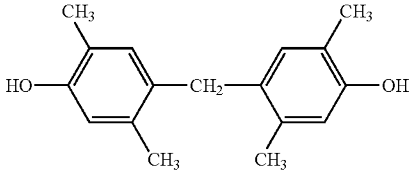

(B-6)

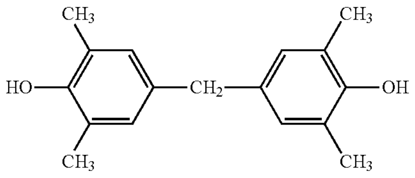

-continued (B-7)

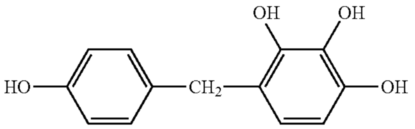

(B-8)

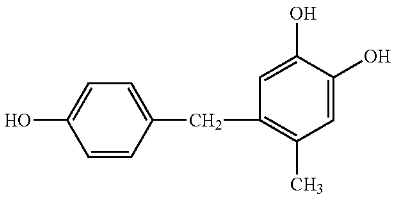

(B-9)

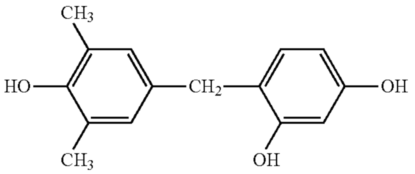

(B-10)

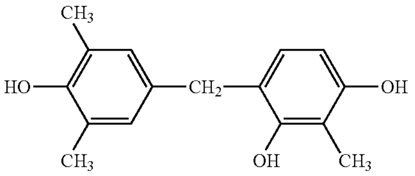

(B-11)

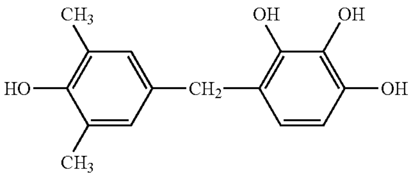

(B-12)

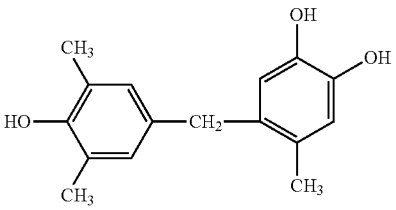

(B-13)

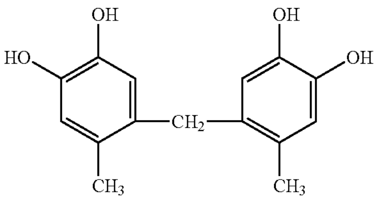

(B-14)

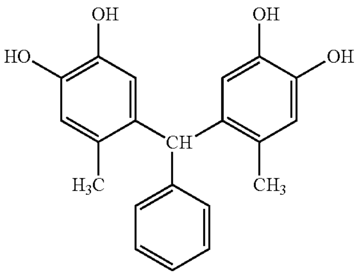

-continued
(B-15)
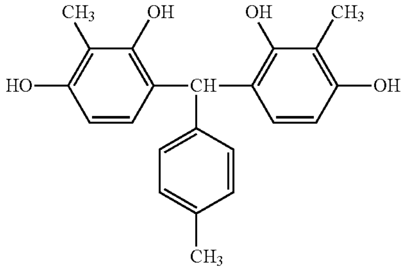
(B-16)
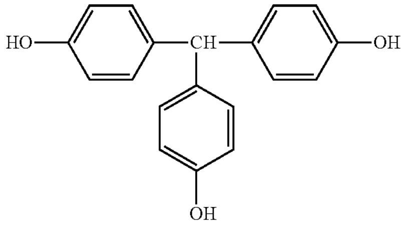
(B-17)
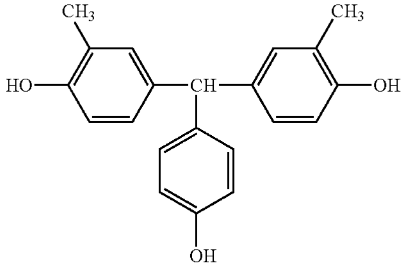
(B-18)
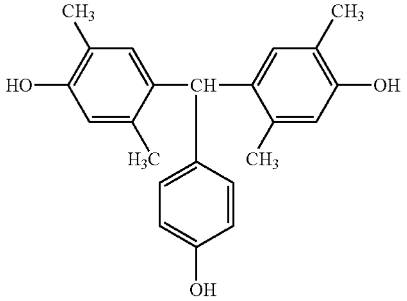
(B-19)
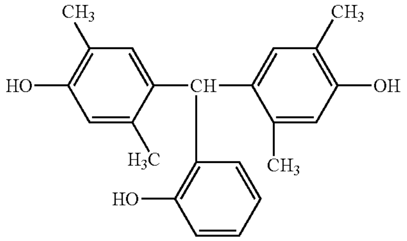
(B-20)
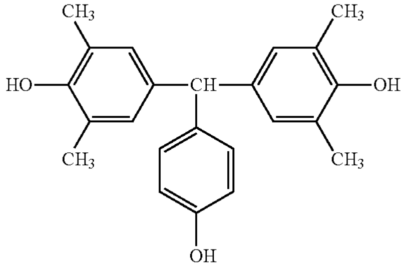
-continued
(B-21)
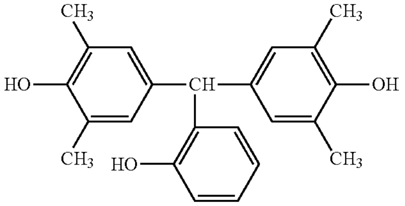
(B-22)
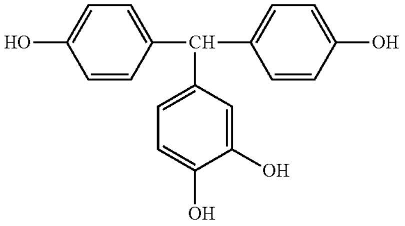
(B-23)
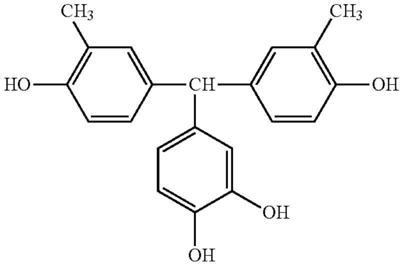
(B-24)
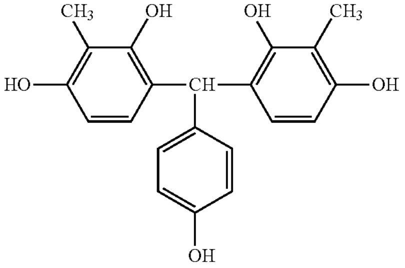
(B-25)
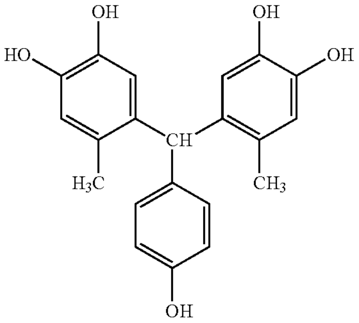
(B-26)
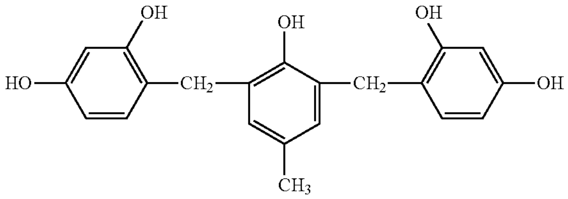

-continued
(B-27)
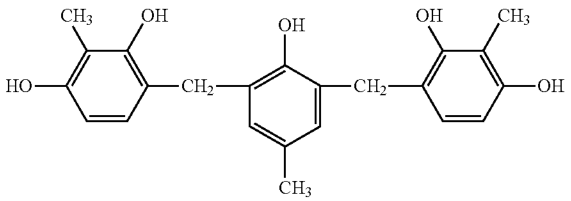
(B-28)
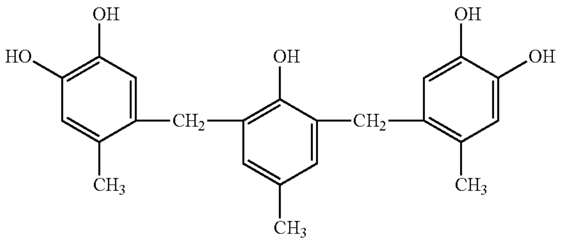
(B-29)
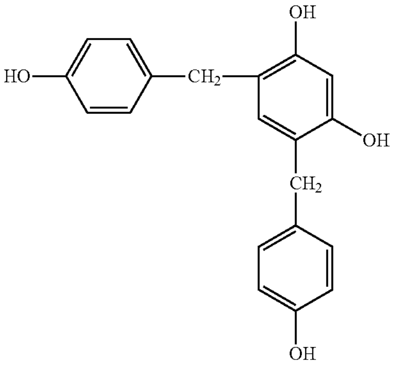
(B-30)
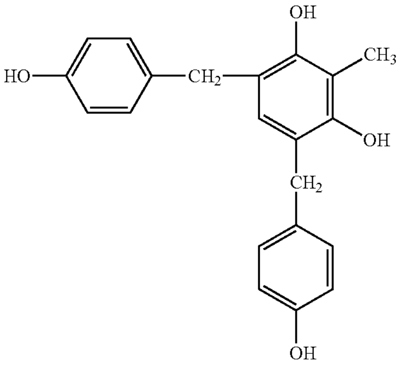
(B-31)
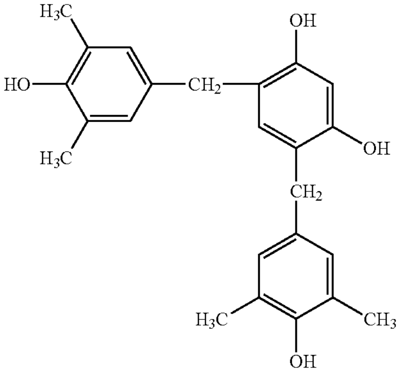
-continued
(B-32)
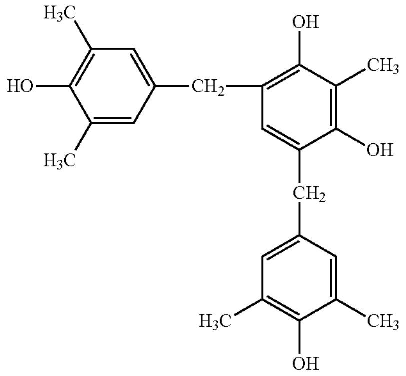
(B-33)
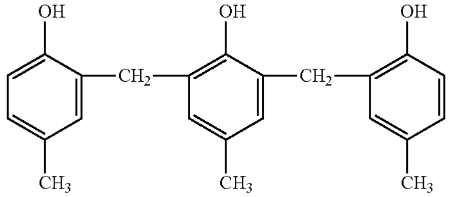
(B-34)
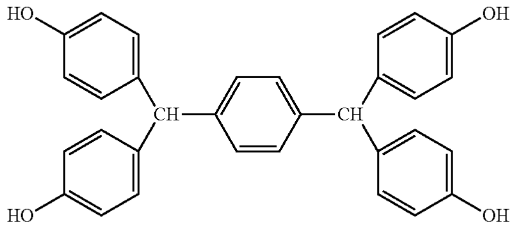
(B-35)
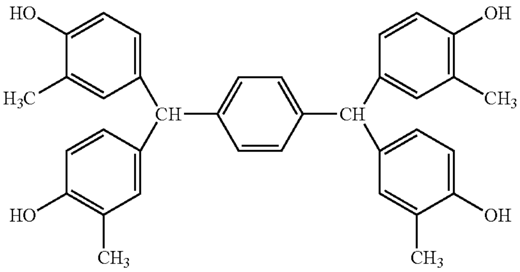
(B-36)
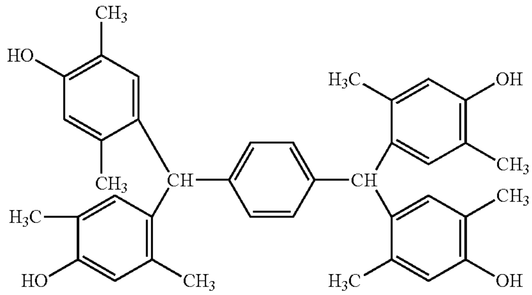

-continued (B-37)

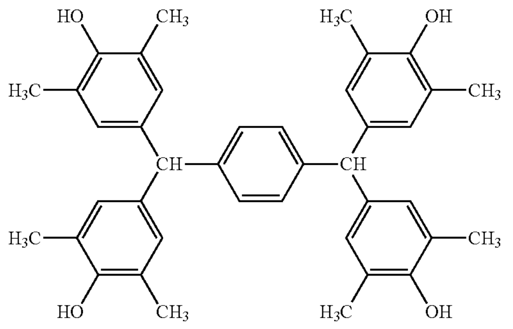

(B-38)

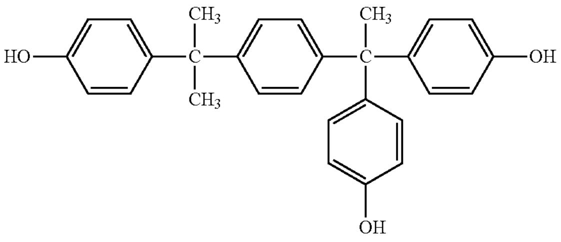

(B-39)

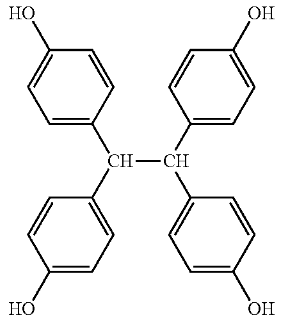

(B-40)

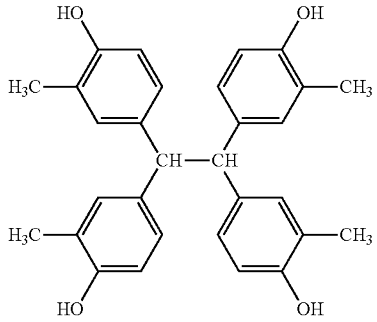

(B-41)

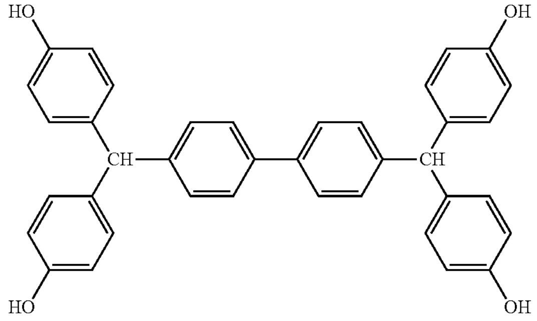

-continued (B-42)

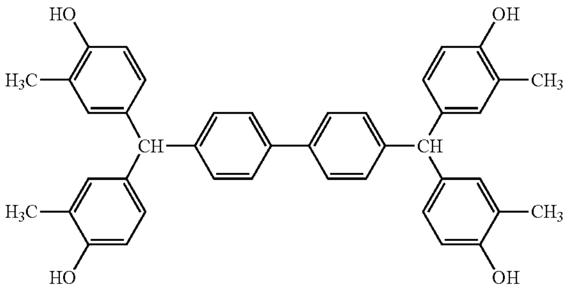

(B-43)

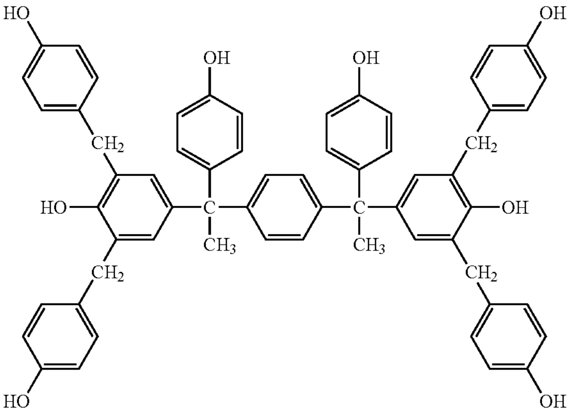

(B-44)

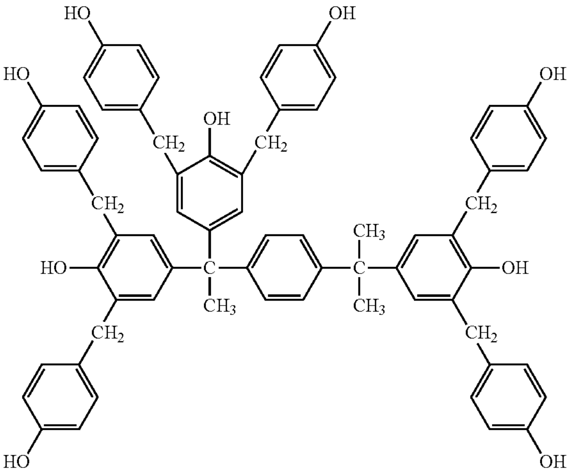

Among the exemplified low nuclides (ballast molecules), (B-3), (B-29), (B-33), (B-38), and the like are suitably used. Compounds formed by replacing the hydrogen atom of phenolic hydroxy group of these ballast molecules with a 1,2-naphthoquinonediazidosulfonyl group are suitably used as the component (B) of the inventive positive photosensitive resin composition.

(30)

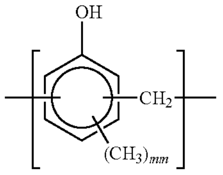

In the formula, mm represents an integer of 0 to 3.

A novolak resin having a repeating unit represented by the formula (30) can be synthesized by condensing phenols represented by the following formula (31), specifically, at least one phenol such as o-cresol, m-cresol, p-cresol and 3,5-xylenol with aldehydes through a conventional method.

(31)

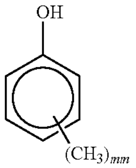

In the formula, mm represents an integer of 0 to 3.

In this case, examples of the aldehyde include formaldehyde, paraformaldehyde, acetaldehyde and benzaldehyde, etc. Formaldehyde is suitable.

Note that the proportion between the phenols represented by the formula (31) and the aldehydes is preferably 0.2 to 2, particularly 0.3 to 2 in the molar ratio.

As a method of introducing a 1,2-naphthoquinonediazidosulfonyl group to the above-described compound to which the 1,2-naphthoquinonediazidosulfonyl group is introduced, it is preferable to use dehydrochlorination condensation reaction, with a basic catalyst, between 1,2-naphthoquinonediazidosulfonyl chloride and the phenolic hydroxy group. In the case of the ballast molecule represented by the formula (25), trihydroxybenzophenone or tetrahydroxybenzophenone, the proportion of replacing the hydrogen atom of the phenolic hydroxy group with a 1,2-naphthoquinonediazidosulfonyl group is 10 to 100 mol % and preferably 50 to 100 mol %. In the case of the novolak resin having a repeating unit represented by the formula (30), it is preferable that the proportion of replacing the hydrogen atom of the phenolic hydroxy group with a 1,2-naphthoquinonediazidosulfonyl group be 2 to 50 mol % and preferably 3 to 27 mol %.

The amount of the component (B) to be added is preferably 1 to 50 parts by mass, and more preferably 10 to 40 parts by mass, relative to 100 parts by mass of the component (A). One kind of the component (B) or a combination of two or more kinds thereof may be used.

By blending such component (B), before exposure, the solubility in an aqueous alkaline solution is prevented due to the dissolution inhibitory property of the component (B), and the system is thus alkaline insoluble. Upon exposure, the photosensitizer of the component (B) generates an acid by the light and increases the dissolution rate in an aqueous alkaline solution, thereby making the system alkaline soluble.

That is, when an aqueous alkaline solution is used as the developing solution, the unexposed part is not dissolved in the developing solution, while the exposed part is soluble in the developing solution. Therefore, a positive pattern can be formed.

Next, in a first embodiment of the positive photosensitive resin composition, the component (D) is a solvent. The solvent as the component (D) is not limited, as long as the components (A) and (B) are dissolved. Examples of the solvent include ketones, such as cyclohexanone, cyclopentanone and methyl 2-n-amyl ketone; alcohols, such as 3-methoxybutanol, 3-methyl-3-methoxybutanol, 1-methoxy-2-propanol and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether and diethylene glycol dimethyl ether; and esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate and γ-butyrolactone; etc. One or more of these can be used simultaneously. In particular, preferable is ethyl lactate, cyclohexanone, cyclopentanone, propylene glycol monomethyl ether acetate, γ-butyrolactone, or a mixed solvent thereof.

The component (D) is blended in an amount of preferably 50 to 2,000 parts by mass, particularly preferably 100 to 1,000 parts by mass, relative to 100 parts by mass of a total amount of the components (A) and (B) to be blended.

Next, a second embodiment of the inventive positive photosensitive resin composition will be described. In the second embodiment, the inventive positive photosensitive resin composition further contains, in addition to the components (A), (B), and (D), (C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2).

(C-1)

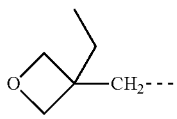

(C-2)

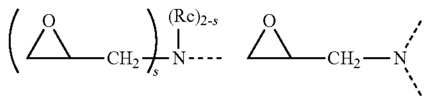

In the formulae, a dotted line represents a bond. Rc represents a linear, branched, or cyclic alkyl group having 1 to 6 carbon atoms. "s" represents 1 or 2.

As the components (A) and (B) in the second embodiment of the inventive positive photosensitive resin composition, those described above for the first embodiment of the positive photosensitive resin composition can be suitably used.

In the second embodiment of the inventive positive photosensitive resin composition, the component (C) is one or more crosslinking agents selected from the group consisting of an amino condensate modified with formaldehyde or formaldehyde-alcohol, a phenol compound having two or more methylol groups or alkoxymethylol groups (alkoxymethyl groups) on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2).

(C-1)

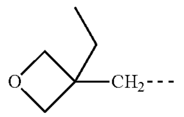

(C-2)

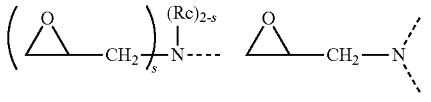

In the formulae, a dotted line represents a bond. Rc represents a linear, branched, or cyclic alkyl group having 1 to 6 carbon atoms. "s" represents 1 or 2.

Examples of the amino condensate modified with formaldehyde or formaldehyde-alcohol include a melamine condensate modified with formaldehyde or formaldehyde-alcohol, and a urea condensate modified with formaldehyde or formaldehyde-alcohol.

In preparation of the melamine condensate modified with formaldehyde or formaldehyde-alcohol, for example, at first, a melamine monomer is modified with formalin for methylolation by a known method, which may be further modified with an alcohol for alkoxylation, thereby obtaining a modified melamine represented by the following general formula (32). Note that the alcohol is preferably a lower alcohol, for example, an alcohol having 1 to 4 carbon atoms.

(32)

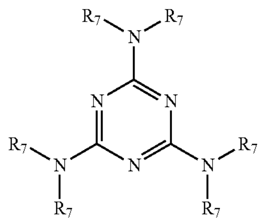

In the formula, each $R_7$ may be identical to or different from the others, and represents a methylol group, a hydrogen atom, or an alkoxymethyl group containing an alkoxy group having 1 to 4 carbon atoms, but at least one $R_7$ is a methylol group or such alkoxymethyl group.

Examples of $R_7$ include a methylol group, a hydrogen atom, alkoxymethyl groups, such as a methoxymethyl group and an ethoxymethyl group, etc.

Specific examples of the modified melamine represented by the general formula (32) include trimethoxymethylmonomethylolmelamine, dimethoxymethylmonomethylolmelamine, trimethylolmelamine, hexamethylolmelamine, hexamethoxymethylolmelamine, etc. Then, the modified melamine represented by the general formula (32) or a multimer thereof (for example, oligomer such as dimer and trimer) is subjected to addition condensation polymerization with formaldehyde by a conventional method until a desired molecular weight is achieved, thereby obtaining a melamine condensate modified with formaldehyde or formaldehyde-alcohol.

In preparation of the urea condensate modified with formaldehyde or formaldehyde-alcohol, for example, a urea condensate with a desired molecular weight is modified with formaldehyde for methylolation by a known method, which may be further modified with an alcohol for alkoxylation.

Specific examples of the urea condensate modified with formaldehyde or formaldehyde-alcohol include a methoxymethylated urea condensate, an ethoxymethylated urea condensate, a propoxymethylated urea condensate, etc.

Note that one of these modified melamine and urea condensates may be used singly, or two or more thereof may be used in mixture.

Next, examples of the phenol compound having two or more methylol groups or alkoxymethylol groups on average in one molecule include (2-hydroxy-5-methyl)-1,3-benzenedimethanol, 2,2',6,6'-tetramethoxymethyl bisphenol A, compounds represented by the following formulas (C-3) to (C-7), etc.

C-3

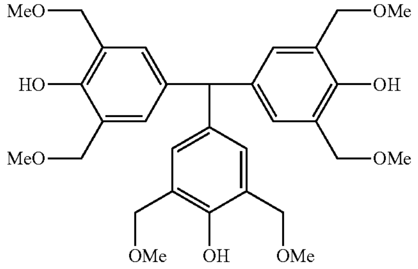

C-4

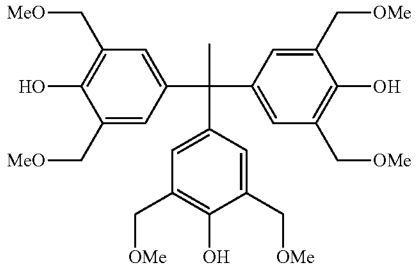

C-5

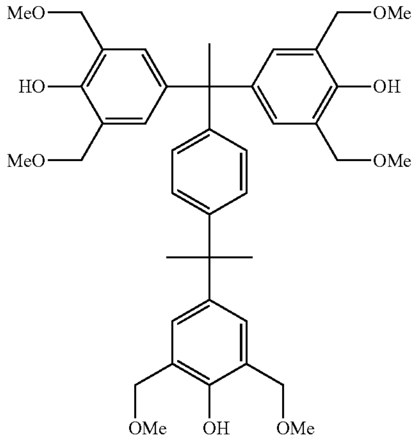

-continued

C-6

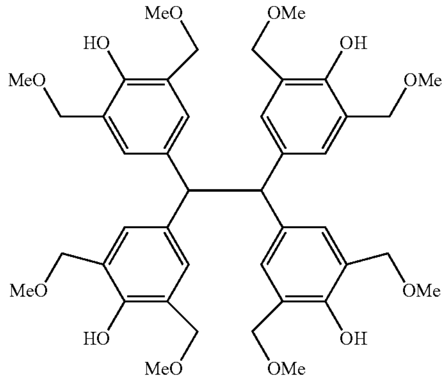

C-7

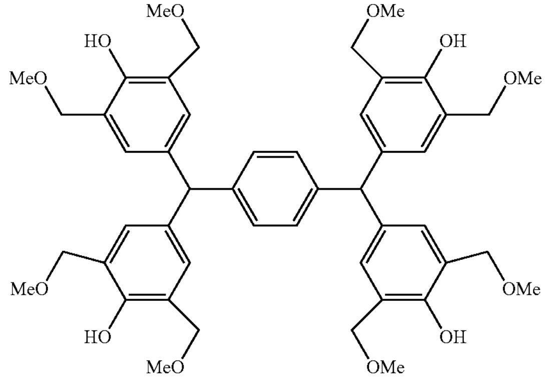

Note that one of the above-described crosslinking agents may be used singly, or two or more thereof may be used in combination.

Meanwhile, examples of the compound in which a hydrogen atom of a hydroxy group of a polyvalent phenol is replaced with a glycidyl group may include compounds obtained by allowing hydroxy groups of bisphenol A, tris(4-hydroxyphenyl)methane and 1,1,1-tris(4-hydroxyphenyl)ethane to react with epichlorohydrin in the presence of a base. Suitable examples of the compound in which a hydrogen atom of a hydroxy group of a polyvalent phenol is replaced with a glycidyl group may include compounds represented by the following formulas (C-8) to (C-14).

C-8

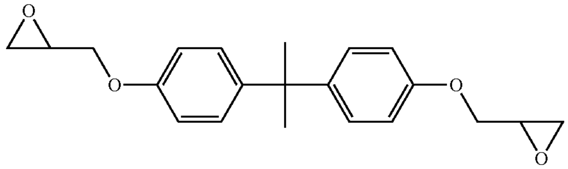

C-9

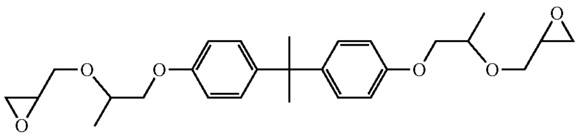

-continued

C-10

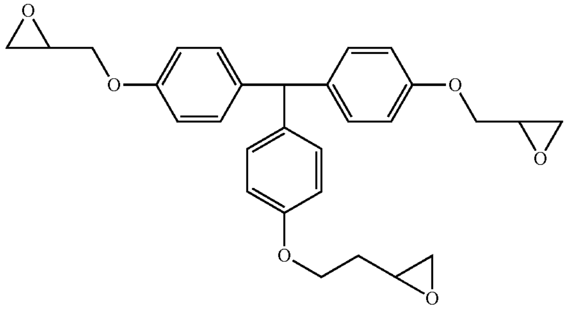

C-11

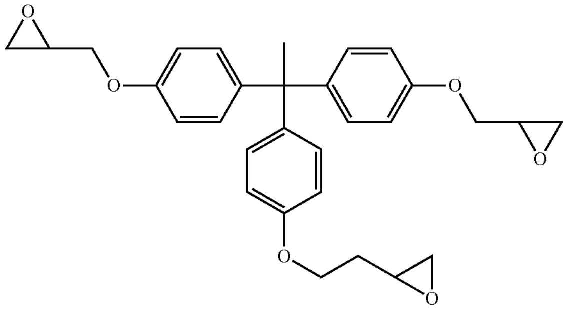

C-12

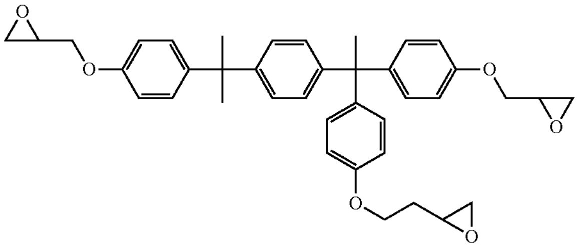

C-13

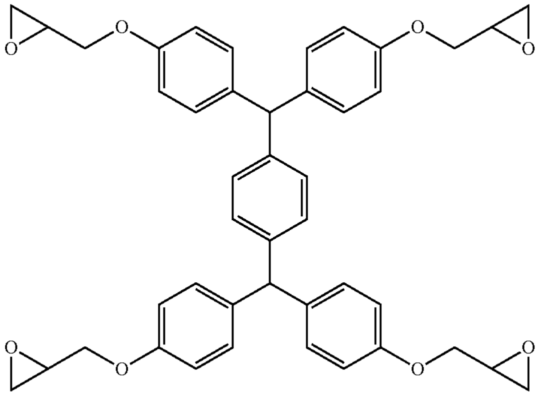

-continued

C-14

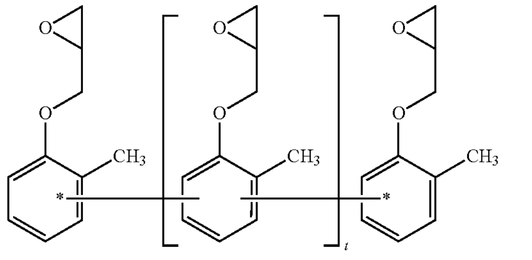

In the formulae, "t" satisfies 2≤t≤3.

One or two of these compounds in which a hydroxy group of a polyvalent phenol is substituted with a glycidoxy group (compound in which a hydrogen atom of a hydroxy group of a polyvalent phenol is replaced with a glycidyl group) may be used as the crosslinking agent.

Examples of the compound in which a hydrogen atom of a hydroxy group of a polyvalent phenol is replaced with a substituent represented by the following formula (C-1) may include a compound containing two or more such substituents and represented by the following formula (C-15):

(C-1)

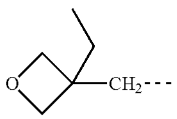

where a dotted line represents a bond, and (C-15)

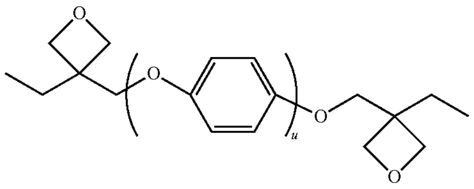

where 1≤u≤3.

Besides, examples of the compound containing two or more nitrogen atoms each having a glycidyl group represented by the following formula (C-2) may include a compound represented by the following formula (C-16):

(C-2)

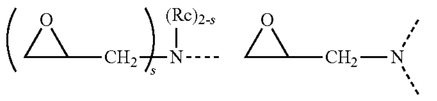

where a dotted line represents a bond, Rc represents a linear, branched, or cyclic alkyl group having 1 to 6 carbon atoms, and "s" represents 1 or 2, and (C-16)

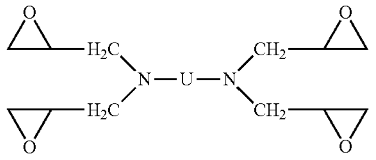

where U represents a linear, branched, or cyclic alkylene group having 2 to 12 carbon atoms, or a divalent aromatic group.

Examples of the compound represented by the formula (C-16) may include compounds represented by the following formulas (C-17) to (C-20).

C-17

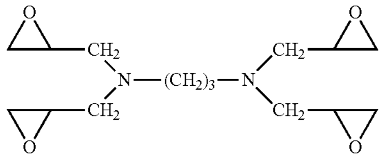

C-18

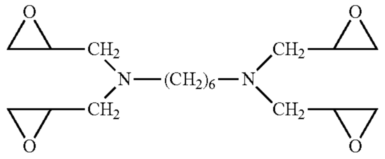

C-19

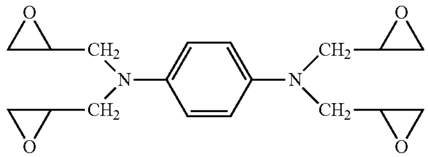

C-20

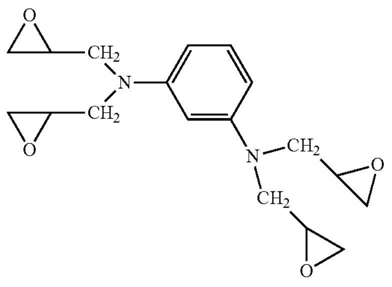

Further, as the compound containing two or more nitrogen atoms each having a glycidyl group represented by the formula (C-2), a compound represented by the following formula (C-21) can be suitably used.

C-21

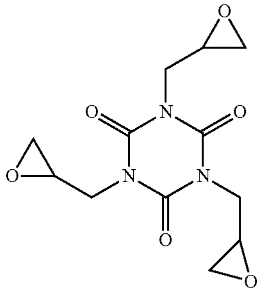

One or two of these compounds containing two or more nitrogen atoms each having a glycidyl group shown in the formula (C-2) may be used as the crosslinking agent.

The component (C) is a component that causes, after the patterning of the positive photosensitive resin composition using a polyimide precursor polymer according to the present invention, crosslinking reaction in the post-curing and further increases the strength of a cured product. The weight-average molecular weight of such component (C) is preferably 150 to 10,000, particularly preferably 200 to 3,000, from the viewpoints of photo-curability and heat resistance.

The component (C) is blended in an amount of preferably 0.5 to 50 parts by mass, particularly preferably 1 to 30 parts by mass, relative to 100 parts by mass of the component (A) in the second embodiment of the inventive positive photosensitive resin composition.

Further, in the second embodiment of the inventive positive photosensitive resin composition, suitable examples of the solvent of the component (D) include the same solvents as those described for the first embodiment of the positive photosensitive resin composition.

The inventive positive photosensitive resin composition can further contain (E) a compound which generates an acid by heat. As the component (E), the compound that generates an acid by heat can be added for the purpose of thermally accelerating crosslinking reaction with the component (A) in the step of heating and post-curing the composition at a temperature of 100 to 300° C. performed after the patterning.

Particularly, as the component (E), preferable are those that do not promote curing of the film before a pattern is formed by development and do not inhibit the patterning. In order to accomplish this, the component (E) preferably does not generate an acid at a temperature of the step of removing the solvent and drying the film after the coating (application) of the photosensitive resin composition, but generates an acid only by heat treatment after the patterning to thereby promote curing of the pattern and film of the positive photosensitive resin composition. Specifically, the component (E) is preferably a compound that is decomposed and generates an acid through a heat treatment at 100° C. to 300° C., preferably 150° C. to 300° C. When such component (E) is contained, the pattern and film of the positive photosensitive resin composition can be changed to a state where crosslinking and curing reaction are more advanced in the step of heating and post-curing at a temperature of 100 to 300° C. performed after the patterning. The component (E) can even further improve the mechanical strength, chemical resistance, adhesiveness, and the like of the obtained pattern or film by even further advancing crosslinking and curing reaction.

A suitable compound that generates an acid by heat is not particularly limited. Compounds described in paragraphs [0061] to [0085] of JP 2007-199653 A can be used.

The compound that generates an acid by heat is blended in an amount of preferably 0.1 parts by mass or more, more preferably 0.5 parts by mass or more, and preferably 30 parts by mass or less, more preferably 10 parts by mass or less, relative to 100 parts by mass of the component (A) in the inventive positive photosensitive resin composition.

In addition, the inventive positive photosensitive resin composition may further contain components other than the components (A), (B), (C), (D), and (E). Examples of the other components include an adhesion auxiliary, (F) a surfactant, etc. As the surfactant (F), compounds exemplified below and the like can be suitably used.

The surfactant (F) is preferably nonionic. Examples thereof include fluorine-based surfactants, specifically, perfluoroalkyl polyoxyethylene ethanols, fluorinated alkyl esters, perfluoroalkylamine oxides, fluorine-containing organosiloxane-based compounds, polyoxyalkylene group-containing organosiloxane-based compounds, etc.

As these surfactants, commercially available products can be used. Examples thereof include Fluorad "FC-4430" (manufactured by Sumitomo 3M Limited), Surflon "S-141" and "5-145" (the above, manufactured by ASAHI GLASS CO., LTD.), UNIDYNE "DS-401", "DS-4031" and "DS-451" (the above, manufactured by DAIKIN INDUSTRIES, LTD.), Megafac "F-8151" (manufactured by DIC Corporation), "X-70-093" and "KP-341" (manufactured by Shin-Etsu Chemical Co., Ltd.), etc. Among them, Fluorad "FC-4430" (manufactured by Sumitomo 3M Limited), "X-70-093" and "KP-341" (manufactured by Shin-Etsu Chemical Co., Ltd.) are preferable.

[Negative Photosensitive Resin Composition]

Among photosensitive resin compositions using the inventive polymer as a base resin, a negative photosensitive resin composition capable of alkaline development will be described. The inventive negative photosensitive resin composition can be, for example, an embodiment to be described below, but is not limited thereto.

The inventive negative photosensitive resin composition contains (A') a polymer containing the structural unit (1), or a polymer containing the structural units (1) and (3);

(B') a photoacid generator;

(C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2), (C-1)

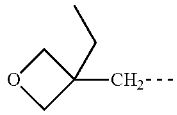

-continued (C-2)

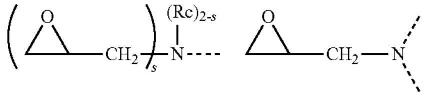

where a dotted line represents a bond, Rc represents a linear, branched, or cyclic alkyl group having 1 to 6 carbon atoms, and "s" represents 1 or 2; and (D) a solvent.

The component (A') of the negative photosensitive resin composition is a polymer containing the structural unit (1), or a polymer further containing the structural unit (3) in addition to the structural unit (1).

In the negative photosensitive resin composition, cross-linking groups of the component (C) can be crosslinked with the polymer of the component (A') using an acid generated from the component (B') as a catalyst, thereby forming a negative type photosensitive resin composition.

The component (B') of the negative photosensitive resin composition is a photoacid generator. The photoacid generator is a material which generates an acid by irradiation with light having a wavelength of 190 to 500 nm, and the acid serves as a curing catalyst. Examples of such photoacid generator include onium salts, diazomethane derivatives, glyoxime derivatives, p ketosulfone derivatives, disulfone derivatives, nitrobenzylsulfonate derivatives, sulfonate ester derivatives, imid-yl-sulfonate derivatives, oximesulfonate derivatives, iminosulfonate derivatives triazine derivatives, etc.

Examples of the onium salt include a compound represented by the following general formula (33):

$$(R_8)_j M^+ K^- \quad (33)$$

where $R_8$ represents a linear, branched, or cyclic alkyl group having 1 to 12 carbon atoms, an aryl group having 6 to 12 carbon atoms, or an aralkyl group having 7 to 12 carbon atoms, all of which optionally have a substituent; $M^+$ represents iodonium or sulfonium; $K^-$ represents a non-nucleophilic counter ion; and "j" represents 2 or 3.

In $R_8$, examples of the alkyl group include a methyl group, an ethyl group, a propyl group, a butyl group, a cyclohexyl group, a 2-oxocyclohexyl group, a norbornyl group, an adamantyl group, etc. Examples of the aryl group include a phenyl group; alkoxyphenyl groups, such as o-, m- or p-methoxyphenyl group, ethoxyphenyl group, and m- or p-tert-butoxyphenyl group; and alkylphenyl groups, such as 2-, 3- or 4-methylphenyl group, ethylphenyl group, 4-tert-butylphenyl group, 4-butylphenyl group, and dimethylphenyl group; etc. Examples of the aralkyl group include a benzyl group, a phenethyl group, etc.

Examples of the non-nucleophilic counter ion of $K^-$ include halide ions, such as chloride ion and bromide ion; fluoroalkylsulfonates, such as triflate, 1,1,1-trifluoroethanesulfonate and nonafluorobutanesulfonate; arylsulfonates, such as tosylate, benzenesulfonate, 4-fluorobenzenesulfonate and 1,2,3,4,5-pentafluorobenzenesulfonate; and alkylsulfonates, such as mesylate and butanesulfonate; etc.

Examples of the diazomethane derivative include a compound represented by the following general formula (34):

(34)

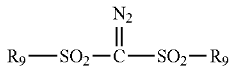

where $R_9$ may be identical to or different from the other, and represents a linear, branched, or cyclic alkyl group or halogenated alkyl group having 1 to 12 carbon atoms, an aryl group or halogenated aryl group having 6 to 12 carbon atoms, or an aralkyl group having 7 to 12 carbon atoms.

In $R_9$, examples of the alkyl group include a methyl group, an ethyl group, a propyl group, a butyl group, an amyl group, a cyclopentyl group, a cyclohexyl group, a norbornyl group, an adamantyl group, etc. Examples of the halogenated alkyl group include a trifluoromethyl group, a 1,1,1-trifluoroethyl group, a 1,1,1-trichloroethyl group, a nonafluorobutyl group, etc. Examples of the aryl group include a phenyl group; alkoxyphenyl groups, such as o-, m- or p-methoxyphenyl group, ethoxyphenyl group, and m- or p-tert-butoxyphenyl group; and alkylphenyl groups, such as 2-, 3- or 4-methylphenyl group, ethylphenyl group, 4-tert-butylphenyl group, 4-butylphenyl group, and dimethylphenyl group; etc. Examples of the halogenated aryl group include a fluorophenyl group, a chlorophenyl group, a 1,2,3,4,5-pentafluorophenyl group, etc. Examples of the aralkyl group include a benzyl group, a phenethyl group, etc.

Specific examples of such a photoacid generator include: onium salts, such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate and diphenyl(4-thiophenoxyphenyl)sulfonium hexafluoroantimonate; diazomethane derivatives, such as bis(benzenesulfonyl)diazomethane, bis(p-toluenesulfonyl) diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)diazomethane; glyoxime derivatives, such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3- pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime and bis-o-(camphorsulfonyl)-α-dimethylglyoxime; oximesulfonate derivatives, such as α-(benzenesulfonium oxyimino)-4-methylphenylacetonitrile; β-ketosulfone derivatives, such as 2-cyclohexylcarbonyl-2-(p-toluenesulfonyl)propane and 2-isopropylcarbonyl-2-(p-toluenesulfonyl)propane; disulfone derivatives, such as diphenyldisulfone and dicyclohexyldisulfone; nitrobenzylsulfonate derivatives, such as 2,6-dinitrobenzyl p-toluenesulfonate and 2,4-dinitrobenzyl p-toluenesulfonate; sulfonate ester derivatives, such as 1,2,3-tris(methanesulfonyloxy)benzene, 1,2,3-tris(trifluoromethanesulfonyloxy) benzene, 1,2,3-tris(p-toluenesulfonyloxy)benzene; imid-yl-sulfonate derivatives, such as phthalimid-yl-triflate, phthalimid-yl-tosylate, 5-norbornene 2,3-dicarboxyimid-yl-triflate, 5-norbornene 2,3-dicarboxyimid-yl-tosylate, 5-norbornene 2,3-dicarboxyimid-yl-n-butyl-sulfonate and n-trifluoromethylsulfonyloxynaphthylimide; iminosulfonate derivatives, such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxy-imino)-5H-thiophen-2-ylidene)-(2-methylphenyl)-acetonitrile; triazine derivatives, such as 2-(methoxyphenyl)-4,6-bis(trichloromethyl)-s-triazine, 2-[2-(3,4-dimethoxyphenyl) ethenyl]-4,6-bis(trichloromethyl)-s-triazine, 2-[2-(furan-2-yl)ethenyl]-4,6-bis(trichloromethyl)-s-triazine, and 2-[2-(5-methylfuran-2-yl)ethenyl]-4,6-bis(trichloromethyl)-s-triazine; 2-methyl-2[(4-methylphenyl)sulfonyl]-1-[(4-methylthio)phenyl]-1-propane, etc. Among them, imid-yl-sulfonates, iminosulfonates, oximesulfonates and the like are suitably used. One of the photoacid generators, or two or more thereof can be used.

The photoacid generator of the component (B') is blended in an amount of preferably 0.05 to 20 parts by mass, particularly preferably 0.2 to 5 parts by mass, relative to 100 parts by mass of the component (A') in the inventive negative photosensitive resin composition from the viewpoints of photoabsorption of the photoacid generator itself and photocurability in a thick film.

As the component (C) of the inventive negative photosensitive resin composition, the same crosslinking agents as the component (C) described for the second embodiment of the positive photosensitive resin composition can be preferably used.

As described above, the component (C) of the inventive negative photosensitive resin composition is a component that not only can form a negative type pattern by using an acid generated from the component (B') as a catalyst to crosslink the crosslinking groups of the component (C) with the polymer of component (A'), but also causes crosslinking reaction in the post-curing after the patterning, thereby further increases the strength of a cured product. The weight average molecular weight of such component (C) is preferably 150 to 10,000 and particularly preferably 200 to 3,000 from the viewpoints of photocurability and heat resistance.

The component (C) is a component that causes crosslinking reaction in the post-curing after the patterning of the negative photosensitive resin composition using the inventive polymer, and further increases the strength of the cured product. The weight-average molecular weight of such component (C) is preferably 150 to 10,000, particularly preferably 200 to 3,000, from the viewpoints of photo-curability and heat resistance.

The component (C) is blended in an amount of preferably 0.5 to 50 parts by mass, particularly preferably 1 to 30 parts by mass, relative to 100 parts by mass of the component (A') in the inventive negative photosensitive resin composition.

As the solvent of the component (D), the solvents exemplified for the positive photosensitive resin composition can be preferably used.

The component (D) is blended in an amount of preferably 50 to 2,000 parts by mass, particularly preferably 100 to 1,000 parts by mass, relative to 100 parts by mass of a total amount of the components (A') and (B') to be blended.

The inventive negative photosensitive resin composition may further contain components other than the components (A'), (B'), (C), and (D). Examples of the other components include an adhesion auxiliary, a polymerization inhibitor to enhance storage stability, a surfactant (F) to be contained for the purpose of improving coating performance, etc. As the surfactant (F), the compounds exemplified above and the like can be suitably used.

In the inventive negative photosensitive resin composition, a basic compound can be added as a component (G), as necessary. As this basic compound, suitable is a compound that can inhibit a diffusion rate of the acid which is generated from the photoacid generator, and which diffuses in the resist film. Moreover, by blending the basic compound, the resolution can be improved, change in sensitivity after exposure can be inhibited, a substrate or environment dependency can be reduced, and exposure margin, pattern shape and the like can be improved.

Examples of the basic compound may include primary, secondary and tertiary aliphatic amines, hybrid amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, compounds represented by the following general formula (35), etc.

$$N(\alpha)_q(\beta)_{3-q} \qquad (35)$$

In the formula, q=1, 2, or 3. The side chain α may be identical to or different from the other(s), and is any of substituents represented by the following general formulas (36) to (38). The side chain β may be identical to or different from the other(s), and represents a hydrogen atom, or a linear, branched or cyclic alkyl group having 1 to 20 carbon atoms, which may contain an ether bond or a hydroxyl group. In addition, the side chains a may be bonded to each other to form a ring.

(36)

$$*-[R^{300}-O-R^{301}]$$

(37)

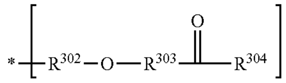

-continued (38)

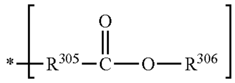

Here, $R^{300}$, $R^{302}$ and $R^{305}$ are each a linear or branched alkylene group having 1 to 4 carbon atoms, and $R^{301}$ and $R^{304}$ are each a hydrogen atom or a linear, branched or cyclic alkyl group having 1 to 20 carbon atoms, each of which may contain one or more hydroxyl groups, ether bonds, ester bonds or lactone rings. $R^{303}$ is a single bond or a linear or branched alkylene group having 1 to 4 carbon atoms, and $R^{306}$ is a linear, branched or cyclic alkyl group having 1 to 20 carbon atoms, each of which may contain one or more hydroxyl groups, ether bonds, ester bonds or lactone rings. Note that * represents a bonding end.

Examples of the primary aliphatic amine include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, etc.

Examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, etc.

Examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, etc.

Examples of the hybrid amine include dimethylethylamine, methylethylpropylamine, benzylamine, phenethyl amine, benzyldimethylamine, etc.

Examples of the aromatic amine and the heterocyclic amine include aniline derivatives (for example, aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (for example, pyrrole, 2H-pyrrole, 1-methylpyrrole, 2,4-dimethylpyrrole, 2,5-dimethylpyrrole, N-methylpyrrole, etc.), oxazole derivatives (for example, oxazole, isoxazole, etc.), thiazole derivatives (for example, thiazole, isothiazole, etc.), imidazole derivatives (for example, imidazole, 4-methylimidazole, 4-methyl-2-phenylimidazole, etc.), pyrazole derivatives, furazan derivatives, pyrroline derivatives (for example, pyrroline, 2-methyl-1-pyrroline, etc.), pyrrolidine derivatives (for example, pyrrolidine, N-methylpyrrolidine, pyrrolidinone, N-methylpyrrolidon, etc.), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl) pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperadine derivatives, morpholine derivatives, indole derivatives, isoindole derivatives, 1H-indazole derivatives, indoline derivatives, quinoline derivatives (for example, quinoline, 3-quinolinecarbonitrile, etc.), isoquinoline derivatives, cinnoline derivatives, quinazoline derivatives, quinoxaline derivatives, phthalazine derivatives, purine derivatives, puteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, etc.

Examples of the nitrogen-containing compound having a carboxyl group include aminobenzoic acid, indolecarboxylic acid, amino acid derivatives (such as, for example, nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine), etc.

Examples of the nitrogen-containing compound having a sulfonyl group include 3-pyridinesulfonic acid pyridinium p-toluenesulfonate, etc.

Examples of the nitrogen-containing compound having a hydroxyl group, the nitrogen-containing compound having a hydroxyphenyl group and the alcoholic nitrogen-containing compound include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperadine, 1-[2-(2-hydroxyethoxy)ethyl]piperadine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, N-(2-hydroxyethyl) isonicotinamide, etc.

Examples of the amide derivative include formamide, N-methylformamide, N,N-dimethylformamide, acetamide, N-methylacetamide, N,N-dimethylacetamide, propionamide, benzamide, etc.

Examples of the imide derivative include phthalimide, succinimide, maleimide, etc.

Examples of the compound represented by the above-described general formula (35) may include, but are not limited to tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy) ethyl]amine, tris[2-(1-ethoxyethoxy)ethyl]amine, tris[2-(1-ethoxyoxopropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis(2-acetoxyethyl)2-(methoxycarbonyl)ethylamine, N,N-bis(2-hydroxyethyl)2-(ethoxycarbonyl)ethylamine, N,N-bis(2-acetoxyethyl)2-(ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl)ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl]ethylamine, N,N-bis(2-acetoxyethyl)2-[(2-oxotetrahydrofuran-3-yl)oxycarbonyl]ethylamine, N,N-bis(2-hydroxyethyl)2-(4-hydroxybutoxycarbonyl)ethylamine, N,N-bis(2-formyloxyethyl)2-(4-formyloxybutoxycarbonyl)ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone. One of the above-described basic compounds, or two or more thereof can be used.

The basic compound is blended in an amount of preferably 0 to 3 parts by mass, particularly preferably 0.01 to 1 parts by mass, relative to 100 parts by mass of the component (A') in the inventive negative photosensitive resin composition from the viewpoint of sensitivity.

(Patterning Method)

Next, patterning methods using the inventive positive photosensitive resin composition and negative photosensitive resin composition will be described.

A positive-type patterning method can be carried out by a patterning method including steps of:

(1) applying the positive photosensitive resin composition onto a substrate to form a photosensitive material film;
(2) heating the photosensitive material film;
(3) exposing the photosensitive material film with a high energy beam having a wavelength of 190 to 500 nm or an electron beam through a photomask; and
(4) developing the film with a developing solution of an aqueous alkaline solution.

A negative-type patterning method can be carried out by a patterning method including steps of:

(I) applying the negative photosensitive resin composition onto a substrate to form a photosensitive material film;
(II) heating the photosensitive material film;
(III) exposing the photosensitive material film with a high energy beam having a wavelength of 190 to 500 nm or an electron beam through a photomask; and
(IV) developing the film with a developing solution of an aqueous alkaline solution.

This negative-type patterning method preferably further includes a step of post-exposure heating of the photosensitive material film between the exposure step (III) and the development step (IV).

In the case of either positive photosensitive resin composition or negative photosensitive resin composition according to the present invention, a pattern may be formed by employing a known lithography technology. For example, a silicon wafer, a $SiO_2$ substrate, a SiN substrate, or a substrate on which a pattern of copper wiring or the like has been formed is coated with the photosensitive resin composition by a spin coating technique (spin coating method) and pre-baked under such conditions of 80 to 130° C. for 50 to 600 seconds to form a photosensitive material film with a thickness of 1 to 50 μm, preferably 1 to 30 μm, further preferably 5 to 20 μm.

In the spin coating method, the photosensitive resin composition can be applied onto the silicon substrate by dispensing the photosensitive resin composition onto the substrate in an amount of approximately 5 mL, and then rotating the substrate. Upon this, the film thickness of the photosensitive material film on the substrate can be readily controlled by adjusting the rotation speed. Then, the remaining solvent can be removed by pre-baking.

Then, a mask for forming the target pattern is put on the photosensitive material film, and a high energy beam, such as i-line and g-line, having a wavelength of 190 to 500 nm or an electron beam is irradiated thereto with an exposure value of approximately 1 to 5,000 $mJ/cm^2$, preferably approximately 100 to 2,000 $mJ/cm^2$.

Next, as necessary, between the exposure step and the development step, heating treatment after the exposure (post-exposure bake (PEB)) may be carried out on a hot plate at 60 to 150° C. for 1 to 10 minutes, preferably at 80 to 120° C. for 1 to 5 minutes.

Thereafter, development is performed. For the above-described inventive positive photosensitive resin composition and negative photosensitive resin composition, alkaline development with an aqueous alkaline solution is possible.

Meanwhile, a suitable aqueous alkaline solution that can be used for the alkali development is a 2.38% aqueous solution of tetramethylammonium hydroxide (TMAH). The development can be carried out by normal methods such as spray method and paddle method, or by dipping the film in a developing solution, for example. Thereafter, by carrying out washing, rinsing, drying and the like, as necessary, a resist film having a desired pattern can be obtained.

(Method for Forming Cured Film)

Further, by heating and post-curing the patterned film obtained by the above-described patterning method at a temperature of 100 to 300° C., preferably 150 to 300° C., and further preferably 180 to 250° C., using an oven, a hot plate, or other heaters, a cured film can be formed. When the post-curing temperature is 100 to 300° C., the crosslinking density of the film of the photosensitive resin composition can be increased and the remaining volatile components can be removed. The post-curing temperature is preferable from the viewpoints of adhesiveness to the substrate, heat resistance and strength, as well as electrical properties. The post-curing time can be 10 minutes to 10 hours.

The formed pattern described above is used for a protective film that covers a wiring, circuit, substrate and the like. Such a formed pattern and protective film have excellent insulating property, and also exhibit excellent adhesive force to wirings to be covered, to a metal layer of a circuit such as Cu, on a metal electrode existing on the substrate, or on an insulating substrate such as SiN existing in wirings or circuits to be coated. Furthermore, the pattern and protective film can also significantly improve the resolution performance for realizing further finer patterning, while having the appropriate mechanical strength as a protective film.

(Cured Film)

The cured film thus obtained is excellent in adhesiveness to a substrate, heat resistance, electrical properties, mechanical strength and chemical resistance to an alkaline stripping solution and the like. A semiconductor element using the cured film as a protective film is also excellent in reliability. In particular, the cured film can prevent cracking upon a temperature cycle test. Therefore, the cured film is suitably used as a protective film (interlayer insulating film or surface protective film) for electrical and electronic components, semiconductor elements, etc.

Thus, the present invention provides an interlayer insulating film or a surface protective film comprising a cured film obtained by curing the above-described positive photosensitive resin composition or negative photosensitive resin composition.

The protective films are effective for applications as an insulating film for semiconductor elements including a rewiring application, an insulating film for multilayer printed circuit board, a solder mask, a coverlay film, and so forth, because the protective films have the heat resistance, chemical resistance and insulating property.

Furthermore, the present invention provides an electronic component having the interlayer insulating film or surface protective film described above.

Such an electronic component has a protective film (interlayer insulating film or surface protective film) with heat resistance, chemical resistance and insulating property, and is thus excellent in reliability.

EXAMPLE

Hereinafter, the present invention will be described specifically with reference to synthesis examples, comparative synthesis examples, examples and comparative examples, but the present invention is not limited by the following examples.

I. Synthesis of Resins

Chemical structural formulas and names of the compounds used in the following synthesis examples are shown below.

AP-1

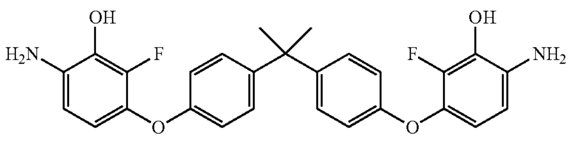

AP-2

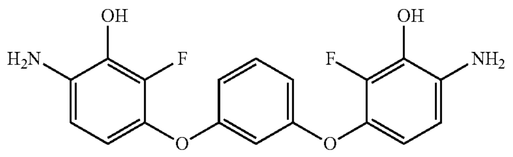

AP-3

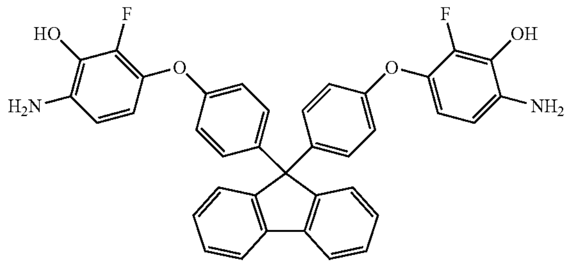

AP-4

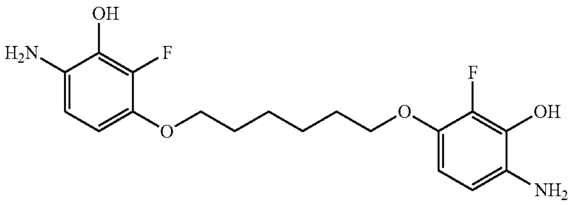

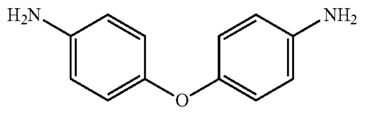

ODA

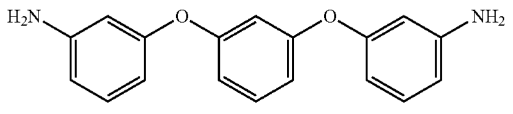

APB

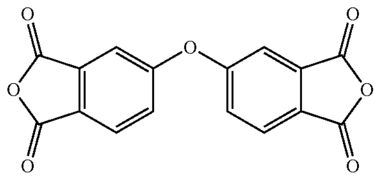

s-ODPA

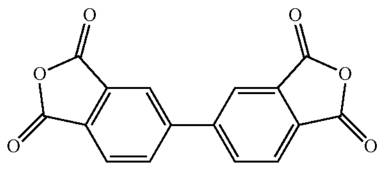

s-BPDA

-continued

DC-1

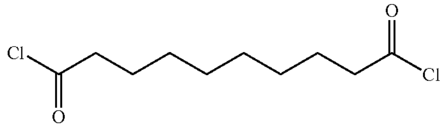

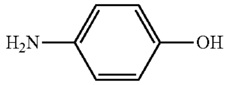

PAP

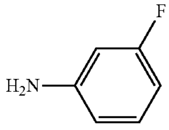

3FA

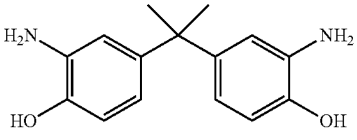

BAP

ODA 4,4'-diaminodiphenyl ether
APB 1,3-bis(3-aminophenoxy)benzene
s-ODPA 3,3',4,4'-oxydiphthalic dianhydride
s-BPDA 3,3',4,4'-biphenyltetracarboxylic dianhydride
DC-1 sebacic acid dichloride
PAP 4-aminophenol
3FA 3-fluoroaniline
BAP 2,2-bis(3-amino-4-hydroxyphenyl)propane
D-400 and RT-1000 are diamines manufactured by Huntsman Corporation.

[Synthesis Example 1] Synthesis of Fluoroaminophenol (AP-1)

Into a 500-ml flask equipped with a stirrer and a thermometer and purged with nitrogen, 20.0 g (87.6 mmol) of 2,2-bis(4-hydroxyphenyl)propane, 25.4 g (184.0 mmol) of potassium carbonate, and 100 g of N-methyl-2-pyrrolidone were added, and the temperature was raised to 150° C. While the resultant was being stirred, 31.4 g (179.6 mmol) of 2,3-difluoro-6-nitrophenol dissolved in 126 g of N-methyl-2-pyrrolidone was added dropwise thereto over 30 minutes, and then stirred at 160° C. for 24 hours. Thereafter, the solution was cooled to room temperature, and mixed with 400 g of water, 400 g of a 10% aqueous hydrochloric acid solution, and 600 g of ethyl acetate. The organic layer was fractionated and then washed five times with 400 g of water. The solvent of the obtained organic layer was distilled off, and the product was recrystallized in ethanol. The obtained crystal was dried under reduced pressure at 60° C. for 15 hours. Thus, 42.7 g of 2,2-bis[4-(4-nitro-3-hydroxy-2-fluorophenoxy)phenyl]propane was obtained.

Next, into a 500-ml flask equipped with a stirrer and a thermometer, 20.0 g (37.1 mmol) of the 2,2-bis[4-(4-nitro-3-hydroxy-2-fluorophenoxy)phenyl]propane, 2.0 g of 10 wt % palladium-carbon, and 300 g of ethanol were added. The flask was purged with hydrogen, and the mixture was stirred at room temperature for 3 hours. After this reaction solution was filtered using celite, the ethanol was distilled off, and the obtained crystal was dried under reduced pressure at 60° C. for 15 hours. Thus, 14.7 g of Fluoroaminophenol (AP-1) was obtained.

[Synthesis Example 2] Synthesis of Fluoroaminophenol (AP-2)

Fluoroaminophenol (AP-2) was obtained in the same formulation as in Synthesis Example 1 except that 2,2-bis (4-hydroxyphenyl)propane was replaced with 9.6 g (87.6 mmol) of resorcinol.

[Synthesis Example 3] Synthesis of Fluoroaminophenol (AP-3)

Fluoroaminophenol (AP-3) was obtained in the same formulation as in Synthesis Example 1 except that 2,2-bis (4-hydroxyphenyl)propane was replaced with 30.7 g (87.6 mmol) of 9,9-bis(4-hydroxyphenyl)fluorene.

[Synthesis Example 4] Synthesis of Fluoroaminophenol (AP-4)

Fluoroaminophenol (AP-4) was obtained in the same formulation as in Synthesis Example 1 except that 2,2-bis (4-hydroxyphenyl)propane was replaced with 10.4 g (87.6 mmol) of 1,6-hexanediol.

Synthesis Examples 5 to 15, Comparative Synthesis Examples 1, 2

Polyimide resins or polyamide-imide resins (A-1) to (A-11), (B-1), and (B-2) were synthesized as follows.

[Synthesis Example 5] Synthesis of Polyimide Resin (A-1)

Into a 1-L flask equipped with a stirrer and a thermometer, 38.3 g (80.0 mmol) of the aminophenol (AP-1) synthesized in Synthesis Example 1, 0.9 g (8.4 mmol) of 4-aminophenol (PAP), and 157 g of N-methyl-2-pyrrolidone were added and stirred at room temperature to dissolve the above compounds. Next, at room temperature, a solution formed by dissolving 26.1 g (84.2 mmol) of 3,3',4,4'-oxydiphthalic dianhydride (s-ODPA) in 264 g of N-methyl-2-pyrrolidone was added dropwise thereto. After the completion of the dropwise addition, the mixture was stirred at room temperature for 3 hours. Then, 20 g of xylene was added to this reaction solution, and heated to reflux at 170° C. for 3 hours while generated water was being removed out of the system. After cooled to room temperature, this reaction solution was added dropwise to 2 L of ultrapure water under stirring. The precipitate was separated by filtration, washed with water appropriately, and then dried under reduced pressure at 40° C. for 48 hours. Thus, Polyimide resin (A-1) was obtained. When the molecular weight of this polymer was measured by GPC, the weight-average molecular weight in terms of polystyrene was 34,000.

[Synthesis Example 13] Synthesis of Polyamide-Imide Resin (A-9)

Into a 1-L flask equipped with a stirrer and a thermometer, 28.8 g (80.0 mmol) of the aminophenol (AP-2) synthesized in Synthesis Example 2, 0.9 g (8.4 mmol) of 4-aminophenol (PAP), and 119 g of N-methyl-2-pyrrolidone were added and stirred at room temperature to dissolve the above compounds. Next, at room temperature, a solution formed by dissolving 20.9 g (67.4 mmol) of 3,3',4,4'-oxydiphthalic acid dianhydride (s-ODPA) in 211 g of N-methyl-2-pyrrolidone was added dropwise thereto. After the completion of the dropwise addition, the mixture was stirred at room temperature for 3 hours. Then, 20 g of xylene was added to this reaction solution, and heated to reflux at 170° C. for 3 hours while generated water was being removed out of the system. After the resultant was cooled to room temperature, 2.7 g (33.6 mmol) of pyridine was added thereto, and 4.0 g (16.8 mmol) of sebacic acid dichloride (DC-1) was added dropwise such that the temperature was kept at 5° C. or lower. After the completion of the dropwise addition, this reaction solution was returned to room temperature and added dropwise to 2 L of ultrapure water under stirring. The precipitate was separated by filtration, washed with water appropriately, and then dried under reduced pressure at 40° C. for 48 hours. Thus, Polyamide-imide resin (A-9) was obtained. When the molecular weight of this polymer was measured by GPC, the weight-average molecular weight in terms of polystyrene was 32,000.

[Synthesis Example 6] to [Synthesis Example 12], [Synthesis Examples 14, 15], [Comparative Synthesis Example 1, 2], Synthesis of Polyimide Resins or Polyamide-Imide Resins (A-2) to (A-8), (A-10), (A-11), (B-1), (B-2)

Resins (A-2) to (A-8), (A-10), (A-11), (B-1), and (B-2) were obtained in the same formulation as in Synthesis Example 5 in the case of polyimide resin, or in the same formulation as in Synthesis Example 13 in the case of polyamide-imide resin, by using compounds having weights shown in Table 1 below as diamine compound, monoamine compound, tetracarboxylic dianhydride, and dicarboxylic acid dichloride. The molecular weight of each polymer was measured by GPC, and the weight-average molecular weight in terms of polystyrene is shown in Table 1 below.

TABLE 1

| | | Diamine compound | | Monoamine compound | Tetracarboxylic dianhydride | | Dicarboxylic acid dichloride | Molecular weight |
|---|---|---|---|---|---|---|---|---|
| Synthesis Example 5 | A-1 | AP-1 38.3 g (80.0 mmol) | | PAP 0.9 g (8.4 mmol) | s-ODPA 26.1 g (84.2 mmol) | | | 34,000 |
| Synthesis Example 6 | A-2 | AP-2 28.8 g (80.0 mmol) | | PAP 0.9 g (8.4 mmol) | s-ODPA 26.1 g (84.2 mmol) | | | 36,000 |
| Synthesis Example 7 | A-3 | AP-3 48.0 g (80.0 mmol) | | PAP 0.9 g (8.4 mmol) | s-ODPA 26.1 g (84.2 mmol) | | | 33,000 |
| Synthesis Example 8 | A-4 | AP-4 29.5 g (80.0 mmol) | | PAP 0.9 g (8.4 mmol) | s-ODPA 26.1 g (84.2 mmol) | | | 32,000 |
| Synthesis Example 9 | A-5 | AP-1 38.3 g (80.0 mmol) | | PAP 0.9 g (8.4 mmol) | s-ODPA 23.5 g (75.8 mmol) | s-BPDA 2.5 g (8.4 mmol) | | 32,000 |
| Synthesis Example 10 | A-6 | AP-2 28.8 g (80.0 mmol) | | 3FA 0.9 g (8.4 mmol) | s-ODPA 23.5 g (75.8 mmol) | s-BPDA 2.5 g (8.4 mmol) | | 31,000 |
| Synthesis Example 11 | A-7 | AP-2 25.9 g (72.0 mmol) | D-400 3.2 g (8.0 mmol) | PAP 0.9 g (8.4 mmol) | s-ODPA 26.1 g (84.2 mmol) | | | 33,000 |
| Synthesis Example 12 | A-8 | AP-2 25.9 g (72.0 mmol) | RT-1000 8.0 g (8.0 mmol) | PAP 0.9 g (8.4 mmol) | s-ODPA 26.1 g (84.2 mmol) | | | 34,000 |
| Synthesis Example 13 | A-9 | AP-2 28.8 g (80.0 mmol) | | PAP 0.9 g (8.4 mmol) | s-ODPA 20.9 g (67.4 mmol) | | DC-1 4.0 g (16.8 mmol) | 32,000 |
| Synthesis Example 14 | A-10 | AP-2 25.9 g (72.0 mmol) | ODA 1.6 g (8.0 mmol) | PAP 0.9 g (8.4 mmol) | s-ODPA 20.9 g (67.4 mmol) | | DC-1 4.0 g (16.8 mmol) | 34,000 |
| Synthesis Example 15 | A-11 | AP-2 25.9 g (72.0 mmol) | APB 2.3 g (8.0 mmol) | PAP 0.9 g (8.4 mmol) | s-ODPA 20.9 g (67.4 mmol) | | DC-1 4.0 g (16.8 mmol) | 33,000 |
| Comparative Synthesis Example 1 | B-1 | BAP 20.7 g (80.0 mmol) | | PAP 0.9 g (8.4 mmol) | s-ODPA 26.1 g (84.2 mmol) | | | 34,000 |
| Comparative Synthesis Example 2 | B-2 | BAP 20.7 g (80.0 mmol) | | PAP 0.9 g (8.4 mmol) | s-ODPA 20.9 g (67.4 mmol) | | DC-1 4.0 g (16.8 mmol) | 33,000 |

II. Preparation of Photosensitive Resin Compositions

By using the polymers synthesized in Synthesis Examples 5 to 15 and Comparative Synthesis Examples 1, 2 as base resins, resin compositions each with a resin content of 30 mass % were prepared according to the compositions and blend amounts shown in Tables 2 and 3. Thereafter, each resin composition was stirred, mixed, and dissolved, and then subjected to microfiltration using a 0.5-μm filter made of Teflon (registered trademark). Thus, photosensitive resin compositions were obtained. Under the section of solvent in the tables, GBL represents γ-butyrolactone.

TABLE 2

| | Resin Component (A) | Photosensitizer Component (B) | Crosslinking agent Component (C) | | Thermal acid generator Component (E) | Solvent Component (D) | Solubility |
|---|---|---|---|---|---|---|---|
| Photosensitive resin composition 1 | A-1 100 parts by weight | Photosensitizer 1 15 parts by weight | | | | GBL 230 parts by weight | dissolved |
| Photosensitive resin composition 2 | A-9 100 parts by weight | Photosensitizer 1 15 parts by weight | | | | GBL 230 parts by weight | dissolved |
| Photosensitive resin composition 3 | A-1 100 parts by weight | Photosensitizer 1 15 parts by weight | CL-1 10 parts by weight | CL-2 15 parts by weight | | GBL 230 parts by weight | dissolved |
| Photosensitive resin composition 4 | A-2 100 parts by weight | Photosensitizer 1 15 parts by weight | CL-1 10 parts by weight | CL-2 15 parts by weight | | GBL 230 parts by weight | dissolved |
| Photosensitive resin composition 5 | A-3 100 parts by weight | Photosensitizer 1 15 parts by weight | CL-1 10 parts by weight | CL-2 15 parts by weight | | GBL 230 parts by weight | dissolved |
| Photosensitive resin composition 6 | A-4 100 parts by weight | Photosensitizer 1 15 parts by weight | CL-1 10 parts by weight | CL-2 15 parts by weight | | GBL 230 parts by weight | dissolved |
| Photosensitive resin composition 7 | A-5 100 parts by weight | Photosensitizer 1 15 parts by weight | CL-1 10 parts by weight | CL-2 15 parts by weight | | GBL 230 parts by weight | dissolved |
| Photosensitive resin composition 8 | A-6 100 parts by weight | Photosensitizer 1 15 parts by weight | CL-1 10 parts by weight | CL-2 15 parts by weight | | GBL 230 parts by weight | dissolved |
| Photosensitive resin composition 9 | A-7 100 parts by weight | Photosensitizer 1 15 parts by weight | CL-1 10 parts by weight | CL-2 15 parts by weight | | GBL 230 parts by weight | dissolved |
| Photosensitive resin composition 10 | A-8 100 parts by weight | Photosensitizer 1 15 parts by weight | CL-1 10 parts by weight | CL-2 15 parts by weight | | GBL 230 parts by weight | dissolved |
| Photosensitive resin composition 11 | A-9 100 parts by weight | Photosensitizer 1 15 parts by weight | CL-1 10 parts by weight | CL-2 15 parts by weight | | GBL 230 parts by weight | dissolved |
| Photosensitive resin composition 12 | A-10 100 parts by weight | Photosensitizer 1 15 parts by weight | CL-1 10 parts by weight | CL-2 15 parts by weight | | GBL 230 parts by weight | dissolved |
| Photosensitive resin composition 13 | A-11 100 parts by weight | Photosensitizer 1 15 parts by weight | CL-1 10 parts by weight | CL-2 15 parts by weight | | GBL 230 parts by weight | dissolved |
| Photosensitive resin composition 14 | A-2 100 parts by weight | Photosensitizer 1 15 parts by weight | CL-1 10 parts by weight | CL-2 15 parts by weight | E-1 2 parts by weight | GBL 230 parts by weight | dissolved |
| Photos ensitive resin composition 15 | A-9 100 parts by weight | Photosensitizer 1 15 parts by weight | CL-1 10 parts by weight | CL-2 15 parts by weight | E-1 2 parts by weight | GBL 230 parts by weight | dissolved |
| Comparative Photosensitive resin composition 1 | B-1 100 parts by weight | Photosensitizer 1 15 parts by weight | CL-1 10 parts by weight | CL-2 15 parts by weight | | GBL 230 parts by weight | insoluble |
| Comparative photosensitive resin composition 2 | B-2 100 parts by weight | Photosensitizer 1 15 parts by weight | CL-1 10 parts by weight | CL-2 15 parts by weight | | GBL 230 parts by weight | insoluble |

Photosensitive resin compositions 1 to 15 shown in Table 2 relate to the inventive positive photosensitive resin composition described above. Comparative photosensitive resin compositions 1 and 2 were formed by using the polymers synthesized in Comparative Synthesis Examples 1 and 2 as base resins instead of the inventive polymers in the above-described inventive positive photosensitive resin compositions. Photosensitive resin compositions 1 to 15 were dissolved in GBL, but Comparative photosensitive resin compositions 1 and 2 were insoluble in GBL, so that it was impossible to carry out patterning evaluation to be described later.

TABLE 3

| | Resin Component (A) | Photosensitizer Component (B) | Crosslinking Agent Component (C) | | Solvent Component (D) | Solubility |
|---|---|---|---|---|---|---|
| Photosensitive resin composition 16 | A-1 100 parts by weight | Photoacid generator 1 2 parts by weight | CL-3 15 parts by weight | CL-2 15 parts by weight | GBL 230 parts by weight | dissolved |
| Photosensitive resin composition 17 | A-2 100 parts by weight | Photoacid generator 1 2 parts by weight | CL-3 15 parts by weight | CL-2 15 parts by weight | GBL 230 parts by weight | dissolved |
| Photosensitive resin composition 18 | A-3 100 parts by weight | Photoacid generator 1 2 parts by weight | CL-3 15 parts by weight | CL-2 15 parts by weight | GBL 230 parts by weight | dissolved |
| Photosensitive resin composition 19 | A-4 100 parts by weight | Photoacid generator 1 2 parts by weight | CL-3 15 parts by weight | CL-2 15 parts by weight | GBL 230 parts by weight | dissolved |
| photosensitive resin composition 20 | A-5 100 parts by weight | Photoacid generator 1 2 parts by weight | CL-3 15 parts by weight | CL-2 15 parts by weight | GBL 230 parts by weight | dissolved |
| photosensitive resin composition 21 | A-6 100 parts by weight | Photoacid generator 1 2 parts by weight | CL-3 15 parts by weight | CL-2 15 parts by weight | GBL 230 parts by weight | dissolved |
| photosensitive resin composition 22 | A-7 100 parts by weight | Photoacid generator 1 2 parts by weight | CL-3 15 parts by weight | CL-2 15 parts by weight | GBL 230 parts by weight | dissolved |
| photosensitive resin composition 23 | A-8 100 parts by weight | Photoacid generator 1 2 parts by weight | CL-3 15 parts by weight | CL-2 15 parts by weight | GBL 230 parts by weight | dissolved |
| photosensitive resin composition 24 | A-9 100 parts by weight | Photoacid generator 1 2 parts by weight | CL-3 15 parts by weight | CL-2 15 parts by weight | GBL 230 parts by weight | dissolved |
| photosensitive resin composition 25 | A-10 100 parts by weight | Photoacid generator 1 2 parts by weight | CL-3 15 parts by weight | CL-2 15 parts by weight | GBL 230 parts by weight | dissolved |
| photosensitive resin composition 26 | A-11 100 parts by weight | Photoacid generator 1 2 parts by weight | CL-3 15 parts by weight | CL-2 15 parts by weight | GBL 230 parts by weight | dissolved |
| Comparative photosensitive resin composition 3 | B-1 100 parts by weight | Photosensitizer 1 15 parts by weight | CL-3 15 parts by weight | CL-2 15 parts by weight | GBL 230 parts by weight | insoluble |
| Comparative photosensitive resin composition 4 | B-2 100 parts by weight | Photosensitizer 1 15 parts by weight | CL-3 15 parts by weight | CL-2 15 parts by weight | GBL 230 parts by weight | insoluble |

Photosensitive resin compositions 16 to 26 shown in Table 3 relate to the inventive negative photosensitive resin composition described above. Comparative photosensitive resin compositions 3 and 4 were formed by using the polymers synthesized in Comparative Synthesis Examples 1 and 2 as base resins instead of the inventive polymers in the above-described inventive negative photosensitive resin compositions. Photosensitive resin compositions 16 to 26 were dissolved in GBL, but Comparative photosensitive resin compositions 3 and 4 were insoluble in GBL, so that it was impossible to carry out the patterning evaluation to be described later.

Note that, in Tables 2 and 3, details of the photosensitizer (Photosensitizer 1), which is a quinonediazide compound, the photoacid generator (Photoacid generator 1), the cross-linking agents (CL-1) to (CL-3), and the thermal acid generator (E-1) are as follows.

Photosensitizer (Photosensitizer 1)

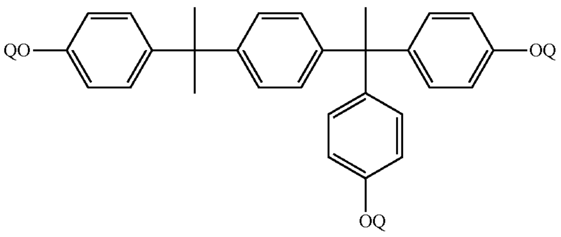

In the formula, Q represents a hydrogen atom or a 1,2-naphthoquinonediazidosulfonyl group represented by the following formula (39), and 90% of Q is replaced with the 1,2-naphthoquinonediazidosulfonyl group represented by the following formula (39).

(39)

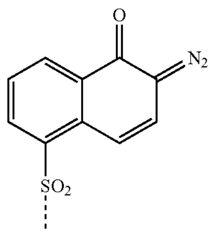

Photoacid Generator (Photoacid Generator 1)

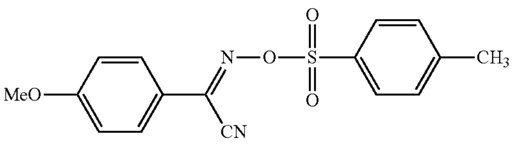 [SMILES: COc1ccc(/C(C#N)=N/OS(=O)(=O)c2ccc(C)cc2)cc1]

Crosslinking Agent (CL-1)

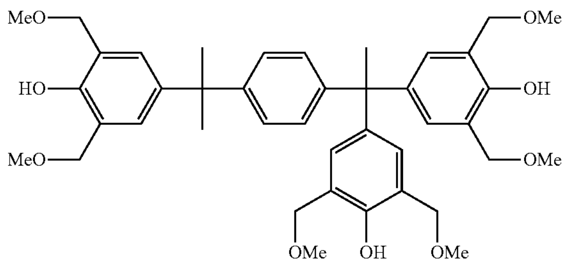 [SMILES: COCc1cc(C(C)(C)c2ccc(C(C)(c3cc(COC)c(O)c(COC)c3)c3cc(COC)c(O)c(COC)c3)cc2)cc(COC)c1O]

Crosslinking Agent (CL-2)

Epoxy resin: EP4000L manufactured by ADEKA CORPORATION

Crosslinking Agent (CL-3)

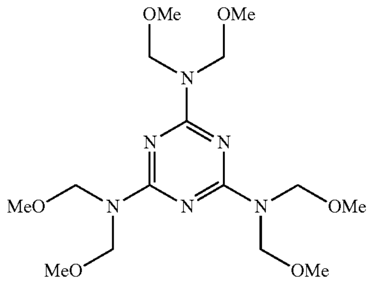 [SMILES: COCN(COC)c1nc(N(COC)COC)nc(N(COC)COC)n1]

Thermal Acid Generator (E-1)

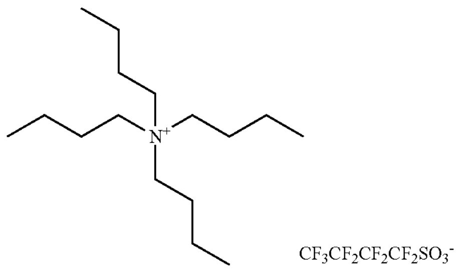

III. Patterning

Photosensitive resin compositions 1 to 26 each in an amount of 5 mL were respectively dispensed onto silicon substrates, and the substrates were then rotated. Thus, by the spin coating method, each of these compositions was applied so as to have a film thickness of 10 μm after the heating for post-curing performed after the patterning. It was found in advance that the film thickness would be reduced after the post-curing step, and the rotation number upon coating was adjusted so that the finished film thickness after the post-curing would become 10 μm.

Next, the compositions applied on the substrates were pre-baked on a hot plate at 100° C. for 2 minutes. Then, an i-line stepper NSR-2205I11 manufactured by Nikon Corporation was used for i-line exposure and patterning. In the patterning, a mask for positive pattern or negative pattern was used appropriately in accordance with the photosensitive resin compositions used. The mask has a pattern capable of forming 20 μm holes arranged by a fineness ratio of 1:1, and can form a hole pattern of 50 μm to 20 μm holes with 10 μm pitch, 20 μm to 10 μm holes with 5 μm pitch, and 10 μm to 1 μm holes with 1 μm pitch.

Next, for those to which the heating step (post-exposure bake) was performed, it was performed under conditions as shown later in Table 5.

In the development step, an aqueous alkaline solution was used as the developing solution, and a 2.38% aqueous solution of tetramethylammonium hydroxide was used as the developing solution. After performing paddle development for 1 minute with the 2.38% aqueous solution of tetramethylammonium hydroxide (TMAH) three times, rinsing with ultrapure water was carried out.

Then, the obtained pattern on the substrate was post-cured using an oven at 190° C. for 2 hours while the oven was purged with nitrogen.

Next, each substrate was cut out so that the shape of the obtained hole pattern can be observed, and the shape of the hole pattern was observed by using a scanning electron microscope (SEM). The aperture of the smallest opening hole at a film thickness of 10 μm after the post-curing was determined, and the pattern shape was evaluated. Together with these results, the sensitivities at which the minimum pattern was successfully formed are shown in Tables 4 and 5.

Note that the shape of the hole pattern was evaluated by the criteria as described below, and the evaluation results were shown in Tables 4 and 5.

Good: holes were observed in a rectangular shape or forward taper shape (the shape in which the dimension of the upper part of a hole is larger than the dimension of the bottom part)

Poor: holes were observed in a reverse taper shape (the shape in which the dimension of the upper part of a hole is smaller than the dimension of the bottom part) or overhang shape (the shape in which the upper part of a hole protrudes), remarkable film thinning was observed, or residue was observed at the bottom part of a hole First, the results obtained by carrying out the patterning using the positive photosensitive resin compositions (Photosensitive resin compositions 1 to 15) are shown in Table 4.

TABLE 4

| | Composition | Pattern | Hole shape | Minimum hole diameter (μm) | Sensitivity ($mJ/cm^2$) |
|---|---|---|---|---|---|
| Example 1 | Photosensitive resin composition 1 | positive type | good | 6 | 460 |
| Example 2 | Photosensitive resin composition 2 | positive type | good | 6 | 440 |
| Example 3 | Photosensitive resin composition 3 | positive type | good | 5 | 340 |
| Example 4 | Photosensitive resin composition 4 | positive type | good | 5 | 320 |
| Example 5 | Photosensitive resin composition 5 | positive type | good | 5 | 360 |
| Example 6 | Photosensitive resin composition 6 | positive type | good | 5 | 320 |
| Example 7 | Photosensitive resin composition 7 | positive type | good | 5 | 380 |
| Example 8 | Photosensitive resin composition 8 | positive type | good | 5 | 400 |
| Example 9 | Photosensitive resin composition 9 | positive type | good | 5 | 360 |
| Example 10 | Photosensitive resin composition 10 | positive type | good | 5 | 380 |
| Example 11 | Photosensitive resin composition 11 | positive type | good | 5 | 320 |
| Example 12 | Photosensitive resin composition 12 | positive type | good | 5 | 380 |
| Example 13 | Photosensitive resin composition 13 | positive type | good | 5 | 380 |
| Example 14 | Photosensitive resin composition 14 | positive type | good | 5 | 340 |
| Example 15 | Photosensitive resin composition 15 | positive type | good | 5 | 340 |

As shown in Table 4, the inventive positive photosensitive resin compositions exhibit good pattern shape in the development with the aqueous alkaline solution, and the minimum hole dimensions thereof exhibit smaller values than the finished film thickness of 10 μm. This verified that the aspect ratio of 1 or more can be accomplished.

Next, the results obtained by carrying out the patterning using the negative photosensitive resin compositions (Photosensitive resin compositions 16 to 26) are shown in Table 5.

TABLE 5

| | Composition | Pattern | Post-exposure bake | Hole shape | Minimum hole diameter (μm) | Sensitivity ($mJ/cm^2$) |
|---|---|---|---|---|---|---|
| Example 16 | Photosensitive resin composition 16 | negative type | 100° C. × 120 sec | good | 6 | 680 |
| Example 17 | Photosensitive resin composition 17 | negative type | 100° C. × 120 sec | good | 6 | 660 |
| Example 18 | Photosensitive resin composition 18 | negative type | 100° C. × 120 sec | good | 6 | 680 |
| Example 19 | Photosensitive resin composition 19 | negative type | 100° C. × 120 sec | good | 6 | 660 |

TABLE 5-continued

| | Composition | Pattern | Post-exposure bake | Hole shape | Minimum hole diameter (μm) | Sensitivity (mJ/cm$^2$) |
|---|---|---|---|---|---|---|
| Example 20 | Photosensitive resin composition 20 | negative type | 100° C. × 120 sec | good | 6 | 680 |
| Example 21 | Photosensitive resin composition 21 | negative type | 100° C. × 120 sec | good | 6 | 700 |
| Example 22 | Photosensitive resin composition 22 | negative type | 100° C. × 120 sec | good | 6 | 680 |
| Example 23 | Photosensitive resin composition 23 | negative type | 100° C. × 120 sec | good | 6 | 680 |
| Example 24 | Photosensitive resin composition 24 | negative type | 100° C. × 120 sec | good | 6 | 660 |
| Example 25 | Photosensitive resin composition 25 | negative type | 100° C. × 120 sec | good | 6 | 640 |
| Example 26 | Photosensitive resin composition 26 | negative type | 100° C. × 120 sec | good | 6 | 640 |

As shown in Table 5, the inventive negative photosensitive resin compositions exhibit good pattern shape in the development with the aqueous alkaline solution, and the minimum hole dimensions thereof exhibit smaller values than the finished film thickness of 10 μm. This verified that the aspect ratio of 1 or more can be accomplished.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A polymer comprising a structural unit represented by the following general formula (1):

(1)

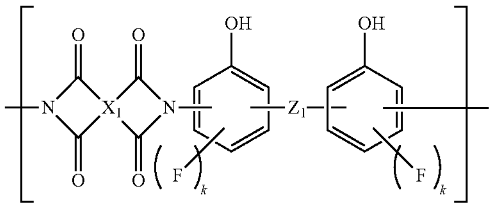

wherein $X_1$ is a tetravalent organic group, $Z_1$ is a divalent organic group, and "k" is an integer of 1 to 3, and the fluorine atom represented by (F) is substituted at the ortho position or para position of the phenolic hydroxy groups.

2. The polymer according to claim 1, wherein the structural unit represented by the general formula (1) is represented by the following general formula (2):

(2)

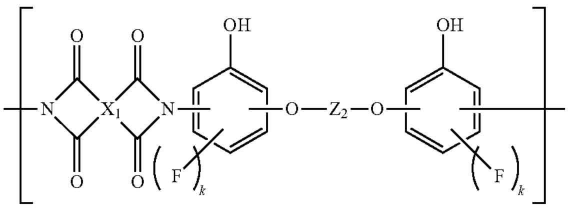

wherein $Z_2$ is a divalent organic group, and $X_1$ and "k" are as defined above.

3. The polymer according to claim 2, further comprising, in addition to the structural unit represented by the general formula (1), a structural unit represented by the following general formula (3):

(3)

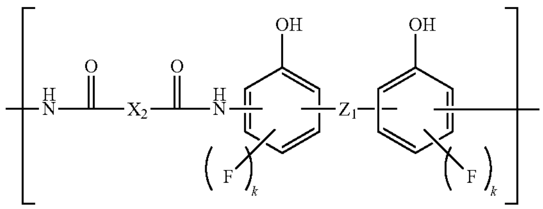

wherein $X_2$ is a divalent organic group, and $Z_1$ and "k" are as defined above.

4. The polymer according to claim 1, further comprising, in addition to the structural unit represented by the general formula (1), a structural unit represented by the following general formula (3):

(3)

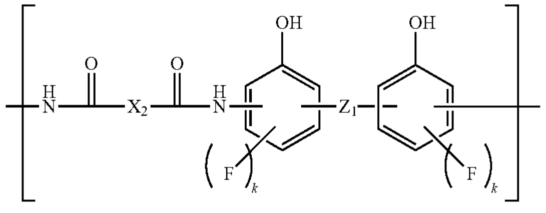

wherein $X_2$ is a divalent organic group, and $Z_1$ and "k" are as defined above.

5. The polymer according to claim 4, wherein the structural unit represented by the general formula (3) is represented by the following general formula (4):

(4)

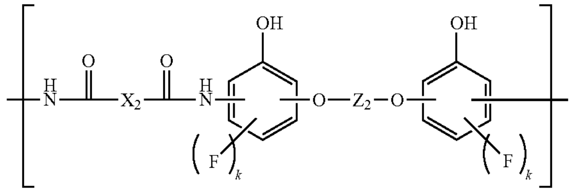

wherein $Z_2$ is a divalent organic group, and $X_2$ and "k" are as defined above.

6. A positive photosensitive resin composition comprising:

(A) the polymer according to claim 1;

(B) a photosensitizer which is a compound having a quinonediazide structure and generates an acid by light to increase a dissolution rate in an aqueous alkaline solution; and (D) a solvent.

7. The positive photosensitive resin composition according to claim 6, wherein the positive photosensitive resin composition further comprises the following component (C):

(C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2), (C-1)

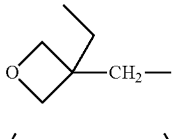

(C-2)

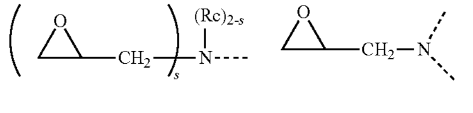

wherein a dotted line represents a bond, Rc represents a linear, branched, or cyclic alkyl group having 1 to 6 carbon atoms, and "s" represents 1 or 2.

8. A patterning method comprising steps of:

(1) applying the positive photosensitive resin composition according to claim 7 onto a substrate to form a photosensitive material film;

(2) heating the photosensitive material film;

(3) exposing the photosensitive material film with a high energy beam having a wavelength of 190 to 500 nm or an electron beam through a photomask; and (4) developing the film with a developing solution of an aqueous alkaline solution.

9. A patterning method comprising steps of:

(1) applying the positive photosensitive resin composition according to claim 6 onto a substrate to form a photosensitive material film;

(2) heating the photosensitive material film;

(3) exposing the photosensitive material film with a high energy beam having a wavelength of 190 to 500 nm or an electron beam through a photomask; and (4) developing the film with a developing solution of an aqueous alkaline solution.

10. A method for forming a cured film, comprising heating and post-curing a patterned film obtained by the patterning method according to claim 9 at a temperature of 100 to 300° C.

11. An interlayer insulating film comprising a cured film of the positive photosensitive resin composition according to claim 6.

12. A surface protective film comprising a cured film of the positive photosensitive resin composition according to claim 6.

13. An electronic component comprising the interlayer insulating film or the surface protective film which comprises a cured film of the positive photosensitive resin composition according to claim 6.

14. A negative photosensitive resin composition comprising:

(A') the polymer according to claim 1;

(B') a photoacid generator;

(C) one or more crosslinking agents selected from the group consisting of an amino condensate modified with formaldehyde or formaldehyde-alcohol, a phenol compound having two or more methylol groups or alkoxymethylol groups on average in one molecule, a compound in which a hydrogen atom of a hydroxy group of a polyvalent phenol is replaced with a glycidyl group, a compound in which a hydrogen atom of a hydroxy group of a polyvalent phenol is replaced with a substituent represented by the following formula (C-1), and a compound containing two or more nitrogen atoms each having a glycidyl group represented by the following formula (C-2), (C-1)

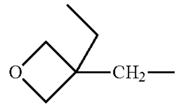

(C-2)

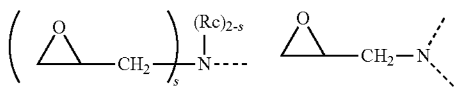

wherein a dotted line represents a bond, Rc represents a linear, branched, or cyclic alkyl group having 1 to 6 carbon atoms, and "s" represents 1 or 2; and (D) a solvent.

15. A patterning method comprising steps of:

(I) applying the negative photosensitive resin composition according to claim 14 onto a substrate to form a photosensitive material film;

(II) heating the photosensitive material film;

(III) exposing the photosensitive material film with a high energy beam having a wavelength of 190 to 500 nm or an electron beam through a photomask; and (IV) developing the film with a developing solution of an aqueous alkaline solution.

16. A method for forming a cured film, comprising heating and post-curing a patterned film obtained by the patterning method according to claim 15 at a temperature of 100 to 300° C.

17. An interlayer insulating film comprising a cured film of the negative photosensitive resin composition according to claim 14.

18. A surface protective film comprising a cured film of the negative photosensitive resin composition according to claim 14.

19. An electronic component comprising the interlayer insulating film or the surface protective film which comprises a cured film of the negative photosensitive resin composition according to claim 14.

20. The patterning method according to claim 15, further comprising a step of post-exposure heating of the photosensitive material film between the exposure step (III) and the development step (IV).

* * * * *